(12) United States Patent
Pennaz et al.

(10) Patent No.: US 7,599,192 B2
(45) Date of Patent: Oct. 6, 2009

(54) LAYERED STRUCTURE WITH PRINTED ELEMENTS

(75) Inventors: Thomas J. Pennaz, Champlin, MN (US); Stephen F. Quindlen, Cary, NC (US); David G. Sime, Minnetonka, MN (US); James P. McDougall, Henderson, NV (US)

(73) Assignee: Aveso, Inc., Fridley, MN (US)

( * ) Notice: Subject to any disclaimer, the term of this patent is extended or adjusted under 35 U.S.C. 154(b) by 680 days.

(21) Appl. No.: 11/209,345

(22) Filed: Aug. 22, 2005

(65) Prior Publication Data

US 2006/0227523 A1 Oct. 12, 2006

Related U.S. Application Data

(60) Provisional application No. 60/670,076, filed on Apr. 11, 2005.

(51) Int. Cl.
*H05K 1/18* (2006.01)

(52) U.S. Cl. .......... 361/761; 361/792; 361/793; 361/794; 361/795; 174/259; 174/260; 174/261; 174/262; 428/209; 428/210

(58) Field of Classification Search .......... 361/761, 361/792–795; 174/250, 259–210; 428/209–210
See application file for complete search history.

(56) References Cited

U.S. PATENT DOCUMENTS

| 4,684,795 | A | 8/1987 | Colgate, Jr. |
| 4,701,601 | A | 10/1987 | Francini et al. |
| 4,841,128 | A | 6/1989 | Grottrup et al. |
| 4,993,810 | A | 2/1991 | Demiryont |
| 5,412,199 | A | 5/1995 | Finkelstein |
| 5,434,405 | A | 7/1995 | Finkelstein |
| 5,608,203 | A | 3/1997 | Finkelstein |
| 5,745,988 | A | 5/1998 | Hohmann et al. |
| 5,756,379 | A | 5/1998 | Haghiri-Tehrani |
| 5,763,869 | A | 6/1998 | Moll et al. |

(Continued)

FOREIGN PATENT DOCUMENTS

DE 19923138 C1 11/2000

(Continued)

OTHER PUBLICATIONS

International Search Report/Written Opinion for PCT Patent Application No. PCT/US2006/013225, mailed Jul. 17, 2008, pp. 8.

(Continued)

*Primary Examiner*—Tuan T Dinh
*Assistant Examiner*—Abiy Getachew
(74) *Attorney, Agent, or Firm*—Oliver A. M. Zitzmann

(57) ABSTRACT

The present invention incorporates electronic components into an electronic core structure that may be readily hot laminated by existing processes. The structure may include multiple desired electronic components, such as a display, battery or other power source, integrated circuits, switches, magnetic stripe emulator, antenna, smart chips or other input devices. The structure includes laminated buffer layers to bridge layers and compensate for variation in electronic component dimensions. The structure may also incorporate battery packaging as part of the core layer structure and use printed electronic circuitry as part of the electronic core layers to impart the desired characteristics. A variety of components may be incorporated in the structure.

16 Claims, 14 Drawing Sheets

U.S. PATENT DOCUMENTS

| | | | |
|---|---|---|---|
| 5,800,763 | A | 9/1998 | Hoppe et al. |
| 5,834,755 | A | 11/1998 | Haghiri-Tehrani et al. |
| 5,851,854 | A | 12/1998 | Haghiri-Tehrani et al. |
| 5,856,661 | A | 1/1999 | Finkelstein et al. |
| 5,857,079 | A | 1/1999 | Claus et al. |
| 5,880,934 | A | 3/1999 | Haghiri-Tehrani |
| 5,888,624 | A | 3/1999 | Haghiri et al. |
| 5,928,788 | A | 7/1999 | Riedl |
| 5,935,693 | A | 8/1999 | Schwenk et al. |
| 5,951,810 | A | 9/1999 | Tarantino |
| 5,962,840 | A | 10/1999 | Haghiri-Tehrani et al. |
| 6,013,945 | A | 1/2000 | Haghiri-Tehrani |
| 6,036,232 | A | 3/2000 | Kaule et al. |
| 6,036,233 | A | 3/2000 | Braun et al. |
| 6,147,320 | A | 11/2000 | Bernecker et al. |
| 6,176,430 | B1 | 1/2001 | Finkelstein et al. |
| 6,176,431 | B1 | 1/2001 | Hoppe et al. |
| 6,283,378 | B1 | 9/2001 | Welling |
| 6,283,509 | B1 | 9/2001 | Braun et al. |
| 6,347,040 | B1 * | 2/2002 | Fries et al. ................. 361/760 |
| 6,379,779 | B1 | 4/2002 | Murl |
| 6,519,497 | B1 | 2/2003 | Blome et al. |
| 6,543,163 | B1 | 4/2003 | Ginsberg |
| 6,575,371 | B1 | 6/2003 | Hoppe et al. |
| 6,639,709 | B2 | 10/2003 | Vincent et al. |
| 6,655,598 | B1 | 12/2003 | Curiel |
| 6,712,397 | B1 | 3/2004 | Mayer et al. |
| D490,104 | S | 5/2004 | Lubking |
| 6,744,549 | B2 | 6/2004 | Vincent et al. |
| 6,745,944 | B2 | 6/2004 | Dell |
| 6,749,925 | B2 | 6/2004 | Hoppe et al. |
| 6,769,618 | B1 | 8/2004 | Finkelstein |
| 6,793,143 | B2 | 9/2004 | Frey et al. |
| 6,817,532 | B2 | 11/2004 | Finkelstein |
| 6,879,424 | B2 | 4/2005 | Vincent et al. |
| 6,902,116 | B2 | 6/2005 | Finkelstein |
| 2002/0167500 | A1 | 11/2002 | Gelbman |
| 2002/0171081 | A1 | 11/2002 | Vincent et al. |
| 2003/0201331 | A1 | 10/2003 | Finkelstein |
| 2003/0222334 | A1 * | 12/2003 | Ikeda et al. ................. 257/678 |
| 2003/0226899 | A1 | 12/2003 | Finkelstein |
| 2004/0056296 | A1 | 3/2004 | Arao et al. |
| 2004/0160540 | A1 | 8/2004 | Hirakata et al. |

FOREIGN PATENT DOCUMENTS

DE            10219306 A1    11/2003

OTHER PUBLICATIONS

International Search Report/Written Opinion for PCT Patent Application No. PCT/US2006/036176, mailed Jul. 17, 2008, pp. 7.
International Search Report/Written Opinion for PCT Patent Application No. PCT/US2006/013236, mailed Jul. 21, 2008, pp. 9.

* cited by examiner

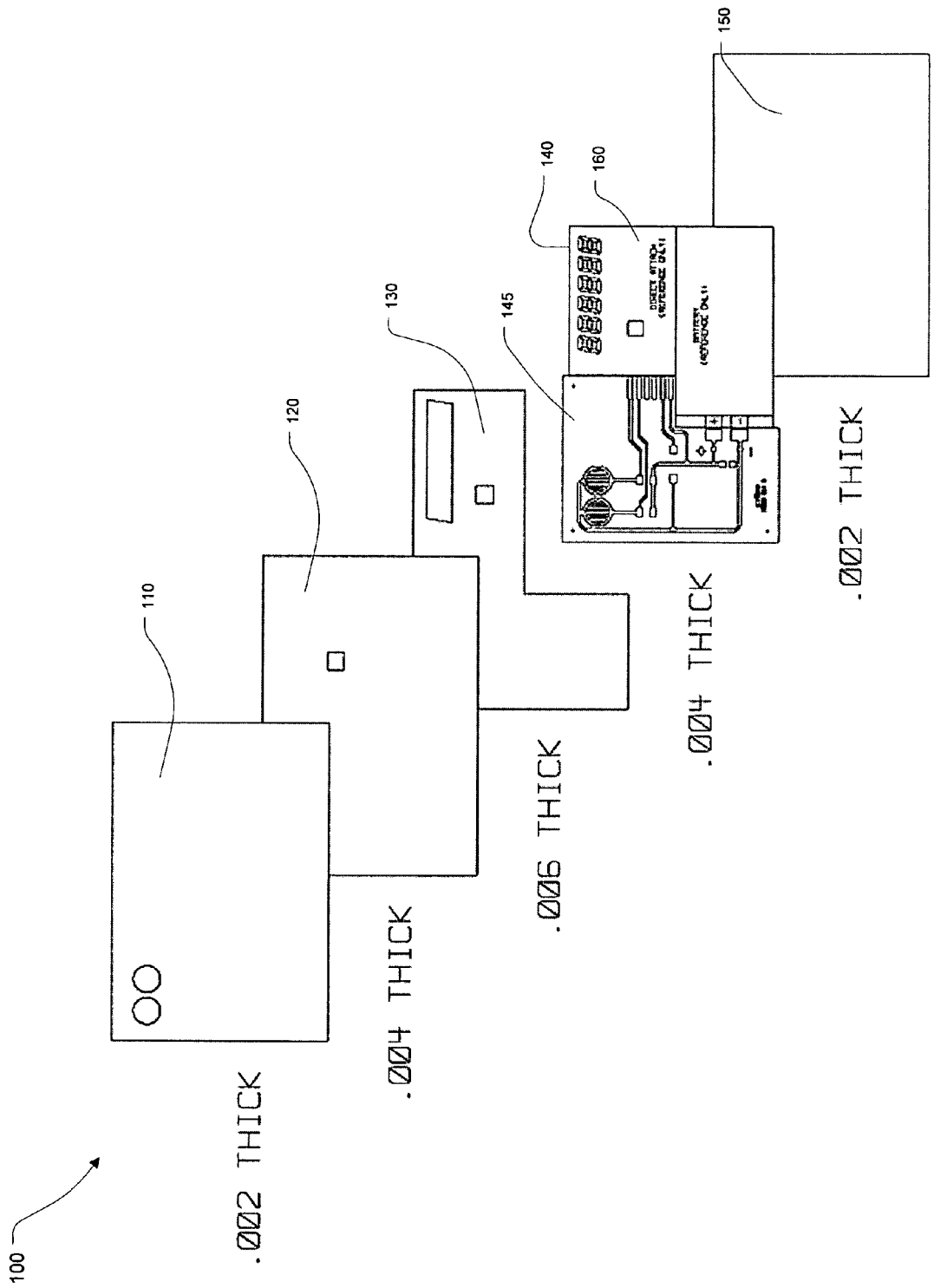

LAYERED STRUCTURE WITH PRINTED ELEMENTS

CROSS REFERENCE TO RELATED APPLICATIONS

This application claims the benefit of U.S. Provisional Application No. 60/670,076, filed Apr. 11, 2005.

FIELD OF THE INVENTION

The present invention relates to a thin, layered structure with built-in electronic functionality, for example a display and associated electronics for driving the display. The display and/or other functional elements in the structure are formed by printing processes.

BACKGROUND OF THE INVENTION

The plastic laminated card industry has relied on the process of hot lamination to produce credit cards, identification cards, loyalty cards and other flat tokens containing information. This process consists of layering a variety of plastic sheets which have a variety of functions such as opacity, graphics and protective layers into the finished stack. The layers can be opaque or clear and may contain functional elements such as magnetic stripes. Once the desired layers have been assembled, the assembly is subjected to heat and pressure to fuse the various layers together to form a continuous structure. As most wallets and purses show, hundreds of millions of cards have been produced to meet a variety of needs. For many situations the card is provided without separate charge, so providers are conscious of cost.

A typical assembly consists of a center layer, a front and a back graphic layer that are typically pre-printed, a magnetic strip and clear protective layers which provide gloss and protect the printed graphics. Often, security features, such as holograms, are included in the structure. Smart cards are produced by adding a microprocessor and chip plate to the card after lamination by milling a recess and mounting the integrated chip plate and integrated circuit. The IC may be attached to an antenna, if desired to allow the IC to communicate through RF in a contactless mode. The preferred materials for existing hot laminated cards include layers made from polyvinylchloride (PVC), polypropylene, polycarbonate, polyester, and other suitable plastics with a melt temperature in the range of approximately 110° C. to 190° C.

The hot lamination process used to produce cards and the like represents the vast majority of installed card production capacity on a global basis. Other processes such as cold lamination, which relies on adhesive bonding, have been developed but have been implemented on a limited basis. Any new card structures are more useful if compatible with existing hot lamination processes.

The desired attributes of a finished laminated card include high gloss, undistorted graphics and uniform, smooth surfaces. In addition, for financial transaction and identification cards, the structure must meet ISO standards. ISO standards for cards define performance requirements such as temperature and humidity resistance, flexibility, lamination integrity, flatness and physical dimensions. The scope of application for an identification card will determine the physical characteristics of the card. Physical characteristics of the cards (ID-1, ID-2 and ID-3) are described in ISO/IEC 7810:2003 *Identification cards—Physical characteristics*. The tests for cards with magnetic stripes, integrated circuits, or optical memory are described in ISO/IEC 10373-1 *Identification cards—Test methods*. The requirements for the contacts in integrated circuit cards are covered by ISO/IEC 7816-1 *Identification cards—Integrated circuit cards with contacts*. The specification for embossed characters is given within ISO/IEC 7811-1:2002 *Identification cards—Recording technique—Part 1: Embossing*. ISO 7813 sets out requirements to be met by financial transaction cards. Whereas, ISO/IEC 7501 covers machine readable travel documents, such as passports and visas. Another type of identification card is the thin flexible card (TFC), which is covered by ISO/IEC 15457. Additional relevant standards are identified in Appendix A. All these standards are incorporated herein by reference.

Incorporating electronic components prior to hot lamination, such as integrated circuits (ICs), antennas, batteries, displays, switches and other circuitry, presents significant difficulty when the hot lamination process is done. The primary difficulty results from the various heights of the different components and the various heat transfer characteristics of the materials employed. Unless these are adequately addressed, performing the hot lamination process with electronic components in place in the layers to be laminated will result in surface defects, unacceptable warping or damage to the internal components.

RFID antennas and their chips have been incorporated into hot laminated cards previously. The antennas, either copper wire, etched metal, or printed silver, are typically connected to a small IC, which is provided as an inlay and is sandwiched into the structure as a discrete layer. The hot lamination process yields acceptable results for RFID primarily because the IC can be limited to a small size and the antenna can be kept thin. However, more complex structures make it more difficult to yield acceptable results, due to the number and size of the components and the need to meet visual and ISO quality standards.

Other approaches to incorporate electronic components in cards involve the formation of cavities through mechanical means such as milling. In one such approach, the card core is milled to produce a cavity that receives the electronic components. After placement of the components, a potting liquid may be added to the milled-out area to level the structure. This approach is relatively slow and does not yield a cost-effective, high volume manufacturing process relative to a simple lamination process.

A variety of approaches have been proposed to address the desire to incorporate more elaborate electronics into card structures. German references, Patentschrift DE 19923138 C1 and Offenlegungsschrift DE 10219306 A1, teach an approach whereby a separate structure is built to contain the electronic components by utilizing loose films which are then hot laminated to fuse the layers. This approach is difficult to implement in high volume due to the inherent variability in raw materials and requires additional steps in the manufacturing process, going beyond lamination, to achieve the desired results. The use of a separate structure to mount the electronic components and subsequently adding discrete layers does not adequately provide a reproducible means to incorporate electronic components cost effectively.

The prior art requires use of films with specific thicknesses that may not match the thickness of the components exactly. To avoid this problem, the manufacturer requires very specific component thicknesses to match the available films. Manufacturing variability of both the components and films will often result in inferior results, due to mismatched heights. Finally, this approach attempts to compensate for the variability of both an individual component and film, but it does not address the increased variability introduced when multiple components are used in a layered structure. The manufacturing process itself introduces the need for tolerances in die cuts and placement that must be accounted for.

One key aspect of certain ISO standards requires a specific thickness for the overall card. ISO standards specify an overall thickness of 0.030±0.002 inches for the card. Because the cards require two graphics layers, which are typically 0.005 inches each, and a clear protective layer, which is typically 0.002 inches, this leaves a total of 0.016 to 0.020 inches available to incorporate the electronic core layers with the functional electronic components.

This requirement presents special challenges if a battery is to be incorporated in the card. Current pre-packaged battery constructions are typically 0.012 to 0.016 inches thick, which does not leave sufficient thickness remaining to easily embed the battery and provide adequate opacity to hide the component. Additionally, current battery packaging techniques result in highly variable package dimensions that must be accounted for during the lamination process.

The ISO standards specifying flexibility also present specific challenges related to incorporation of electronic components into the card. Circuit integrity is an important consideration when producing a flexible product. The lamination process must produce a structure that minimizes stresses on the various components. A variety of electronic components may be included in the card, such as IC's, antennas, switches, batteries, magnetic stripe emulators and displays. Each component may have a different thickness, size, and flexibility but must be packaged in the card and result in desired overall card flexibility while maintaining electrical integrity of the electronic circuits.

It is highly desirable to incorporate a display as part of the electronic package of certain cards. Traditional display technologies are not suitable for incorporation into an ISO compliant card. A variety of limitations are inherent in displays of the prior art. To successfully integrate a display, the preferred display is flexible, uses low power to minimize battery requirements, operates at less than 3V to minimize the number of electronic components required, and can be hot laminated using current processes.

There is a need for an electronic core structure with associated electronic components, which may include a display, that can be hot laminated and meets ISO standards for financial transaction and/or identification cards. In particular, parties producing cards for delivery to customers by applying customized final graphic layers need an electronic core structure that provides the functionality to satisfy customer needs.

BRIEF SUMMARY OF THE INVENTION

The present invention involves a thin, layered structure for providing a laminated unit that contains a variety of electronic components. The present invention may be used to produce efficiently an electronic core structure that provides specified electronic functionality of a variety of financial card and other applications, that has the required structural integrity, and that permits finishing layers to be applied while remaining consistent with dimensional requirements, flexibility, and other physical requirements of the particular application, as specified by standards and/or user requirements. In addition, because all of the elements and components of the layered structure may either be printed in a generally conventional printing line or readily added to the printing line, the structure can be produced efficiently, rapidly, and affordably.

The structure includes a flexible base sheet, suitable for lamination to an adjacent lower cover surface, and a flexible top sheet, suitable for lamination to an adjacent upper cover surface. The embedded electronic components are laminated between the flexible base sheet and top sheet. A variety of components may be included between the two sheets, such as switches, magnetic stripe emulator, antenna, displays, smart card chips or other input or data handling devices.

In one, non-limiting embodiment, the electronic core structure has a display cell having connection points for an integrated circuit for driving the display and having electrical traces leading from such connection points to a power source. The display may be formed by printing a plurality of pixels that are matingly connected to the display-receiving connection points or otherwise operably connected to the integrated circuit driver. Further, a least one pre-formed component connection sheet having two or more surfaces and having electrical traces printed on one or more surfaces is operably connected to the display cell and secured between the base sheet and top sheet. A buffer layer is placed between the base sheet and top sheet, the buffer layer being made of a formable material that compensates for thickness differences between components and height variations within components in the display cell and permits a desired overall thickness for the layered structure to be achieved in a reproducible fashion.

The invention further involves a method of making a thin, layered structure with a display or other electronic components by providing a flexible base sheet and providing a display cell with an attached integrated circuit for driving a display, a display formed by printing a plurality of pixels with an electrode and a corresponding layer of electrochromic ink and traces electrically operably connecting the integrated circuit and the pixels. The method further comprises providing a power source electrically operably connected to the integrated circuit and providing at least one cover layer interposed adjacent to the display cell and having one or more external or internal surfaces with printed electrical components that are operably connected to one or more of the integrated circuit, the power source and the display. The base sheet, electronic components, power source and cover layer are combined into a laminated unit, by interposing at least one buffer layer between the preceding elements. The buffer layer is formed so as to compensate for dimensional variations in the dimensions of the electronic components and providing a range in its own vertical dimensions suitable to achieve a desired total vertical dimension for the laminated unit.

In another embodiment, the invention involves making a thin, layered structure with electronic components by providing a flexible base sheet and providing a display cell with an attached integrated circuit for driving a display by printing a plurality of pixels with an electrode and a corresponding layer of electrochromic ink and traces electrically operably connecting the integrated circuit and the pixels. The method further comprises providing a power source electrically operably connected to the integrated circuit and providing at least one cover layer interposed adjacent to the display cell by printing on one or more external or internal surfaces electrical components that are operably connected to one or more of the integrated circuit, the power source and the display. The base sheet, display cell, power source and cover layer are combined into a laminated unit, by interposing at least one buffer layer between the preceding elements. The buffer layer is formed and laminated so as to compensate for dimensional variations in the thickness of the display cell, power source, and other electronic components and providing a range of thickness in its own vertical dimension sufficient to achieve a desired total vertical dimension for the laminated unit.

In another embodiment of the present invention that also may be used in a card, the interconnecting circuitry provided by the layered structure is implemented to minimize the number of IC's present in the structure. For example, existing smart cards require communication with a reader structure outside the card structure, which is accomplished through a contact chip plate or through a contactless antenna. The traditional smart card IC is located on the chip plate and contains software to provide the communication protocol with the reader and performs functions such as cryptography and stored value calculations. Many electronic components, such as displays or magnetic stripe emulators, require an IC to control their functions. The present invention allows the combination of all components on one IC to perform all necessary control, communication, and data manipulation functions. Communication is accomplished by mounting a chip plate that provides the standardized contacts—without an IC, antenna, or emulator—and providing the interconnecting circuitry in the layered structure to an IC elsewhere in the structure.

The buffer layer is applied by a printing technique in the liquid state and is fluid during lamination to fill voids and to level the structure to a uniform, desired thickness as the buffer layer flows to compensate for the dimensional variations. After the buffer layer has been applied and the proper thickness set, the buffer materials cure to hold the various components in place during handling and final lamination. One or more buffer layers may be used. Nip rollers may be used after application of buffer layer material and/or any printing step to achieve desired dimensioning. The printing of electrical components on two or more external or internal surfaces may involve printing conductive traces, or resistive or dielectric materials, which may be joined with other printed layers to form the desired components, including antennas, capacitors, displays, or resistors. A battery may also be formed by using printing techniques to apply layers of battery material that comprise the anodes, cathodes, current collectors, and electrolyte. The buffer layer should be compatible with the plastics employed as the core layers especially during the hot lamination process.

The electronic core structure materials may form the battery packaging when printing techniques are used to form the battery. The buffer layer may also form all or a portion of a seal to contain the electrolyte of the battery prior to final lamination. The buffer layer may cure with sufficient strength so as to permit handling of the electronic core structures prior to final lamination into the final card product distributed to consumers or others.

BRIEF DESCRIPTION OF THE DRAWINGS

FIG. 3 is a schematic exploded view of one structure for the present invention incorporating the display cell.

DETAILED DESCRIPTION OF THE INVENTION

Introduction

Figure 1:
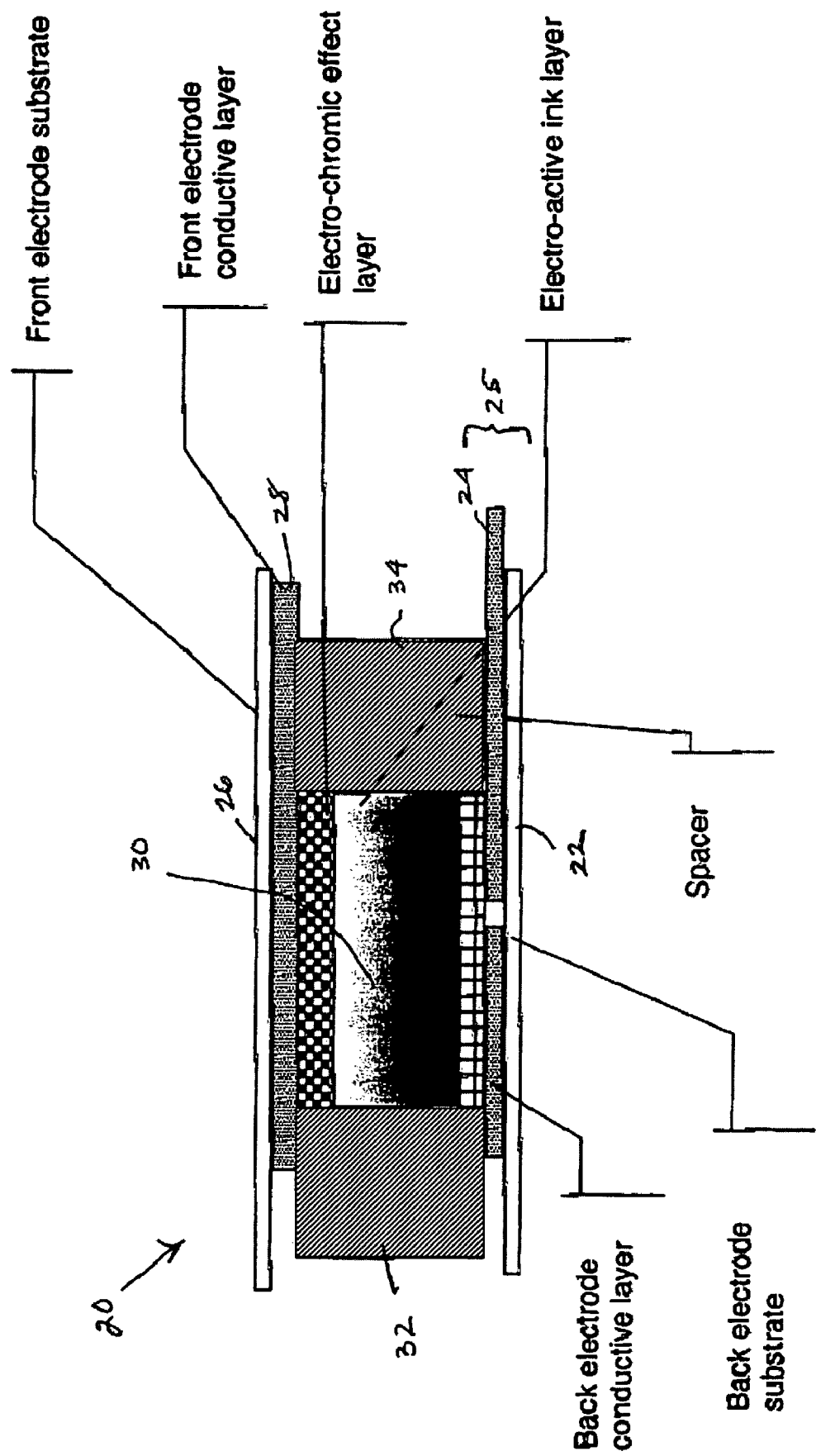
FIG. 1 is a schematic cross-section side view of a display cell component.

The present invention provides a solution to various deficiencies of the prior art by incorporating electronic components into an electronic core structure that may be readily hot laminated by existing processes. The structure includes a means to include multiple desired electronic components, such as a display, battery or other power source, integrated circuits, switches, magnetic stripe emulator, antenna, smart chips or other input devices. The structure includes the use of laminated buffer layers to bridge layers and compensate for variation in component dimensions. It may also incorporate battery packaging as part of the core layer structure and use printed electronic circuitry as part of the electronic core layers to impart the desired characteristics.

As described, a variety of components may be incorporated in the structure. In one, non-limiting embodiment, a display is included in the layered structure. However, those skilled in the art will appreciate that a variety of layered structure applications are provided for by the invention herein without the inclusion of a display.

A display cell that may be used as a sub-assembly of the electronic core structure embeds electronic components and can be processed through traditional hot lamination process with other layers to conform to relevant ISO standards. The display cell may form the focal point of a smart card, label, or other thin information-displaying structure and contain a variety of components. Typical components include combinations of ICs, displays, batteries, switches, antennas, and connecting circuitry.

The required ICs for a particular electronic core depend on the end application. In some cases, two or more chips may be necessary to perform the required functions. The first will generate and/or transmit the data based generally on external inputs. For example, in one card a micro-processor generates a Transaction Authorization Number based on a pre-programmed algorithm after input from a switch on the card. The data is subsequently sent to a display drive chip that converts the data stream into a displayed image. Alternatively, a radio frequency receiver circuit may take a signal from either a specific reader device or from broadcast radio waves and convert the signal into a data stream to the display driver. In other cases, a single chip may be used both to generate the necessary data as well as drive the display to produce the desired value. If a display is not present in the structure, the IC may be used to communicate with a reader through a contact pad, RF antenna, or magnetic strip emulator. The electronic core structure contains IC's where dynamic communication to equipment outside the card is required.

One challenge arises from the different components in the structure having varying heights and any one component having inherent dimensional variability due to manufacturing tolerances of the components and films. In particular, IC components will not be perfectly uniform. The variation in IC height will result from two primary sources: die height differences and variation due to attachment to a substrate. The variation in die height is a result of tolerances during the grinding and polishing of silicon wafers. The height variations due to die attachment are a function of the method employed. Where wire-bonding techniques are employed, loop height and the adhesive method will introduce variation. Flip Chip attach methods generate variation as a result of die bumping variation as well as the bonding technique employed. In both cases, the use of an encapsulant will provide significant additional variation. Typical die heights for attached components are approximately 0.007 to 0.012 inches without encapsulant.

One display usable with the present invention, including electrochromic inks, has previously been disclosed in U.S. Pat. Nos. 6,639,709 and 6,744,549 and in U.S. Publication No. 2002/0171081 A1, although the scope of the present invention includes other display technologies as well. The displays may be produced through a traditional printing process which introduces some variation in height. However, the preferred displays exhibit significant advantages over other display technologies for this application. The advantages include flexibility, low power requirements and a robust construction which survives the hot lamination process. The typical height of the preferred displays is approximately 0.006 inches (0.150 mm). The display height may vary slightly by variation in print height as well as variation in the height of individual components of the display such as the backplane films, indium tin oxide (ITO) front plane films and adhesive gaskets.

As noted, the display may be formed by printing with special inks that are electrochromic. With the exception of the IC and certain small-scale pads and traces associated with the IC and display, other structures on the various layers described as made or assembled herein are also formed by printing methods and the layers are joined by lamination adhesives or other materials applied by printing techniques. Suitable printing methods include screen printing, flexographic, and gravure printing. Use of these methods permits high-volume, efficient production of the structures without the clean room environment and special thin film formation equipment typically used to make such functional structures. That is, it permits cost efficient, scalable production of large numbers of core structures that can readily be processed into final cards.

The Outer Layers

Figure 2A:
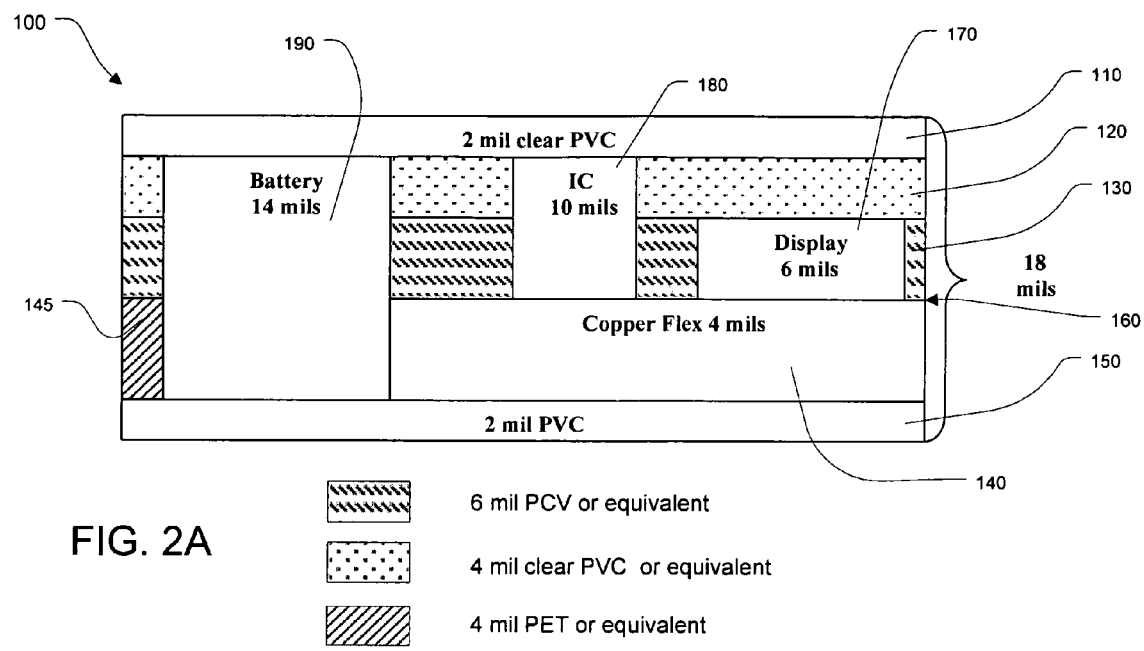
FIG. 2A is a schematic cross-section side view of the structure of the present invention incorporating the display cell and a battery.
Figure 2B:
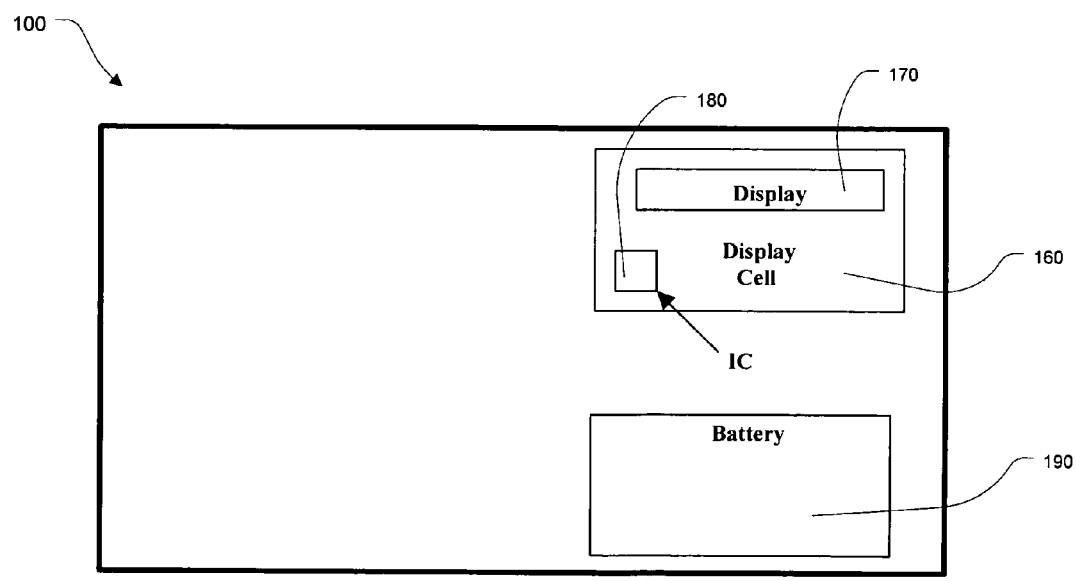
FIG. 2B is a schematic top view of the structure of the present invention incorporating the display cell.

As best seen in FIG. 2A, the outer layers of the structure 100 described herein are a flexible base sheet 150 and a flexible top sheet 110. These layers are typically made of PVC, polypropylene, or other suitable thermoplastics. Each has a thickness of about 1.5 mils to 3 mils, and the preferred thickness is about 2 mils. As shown in FIG. 2A, the outer layers 10 and 150 sandwich various electronic components, such as display cell 160, built on flex circuit substrate layer 140 and including display 170 and IC 180, battery 190, and interior layers, such as first cover layer 120 and second cover layer 130.

Figure 5:
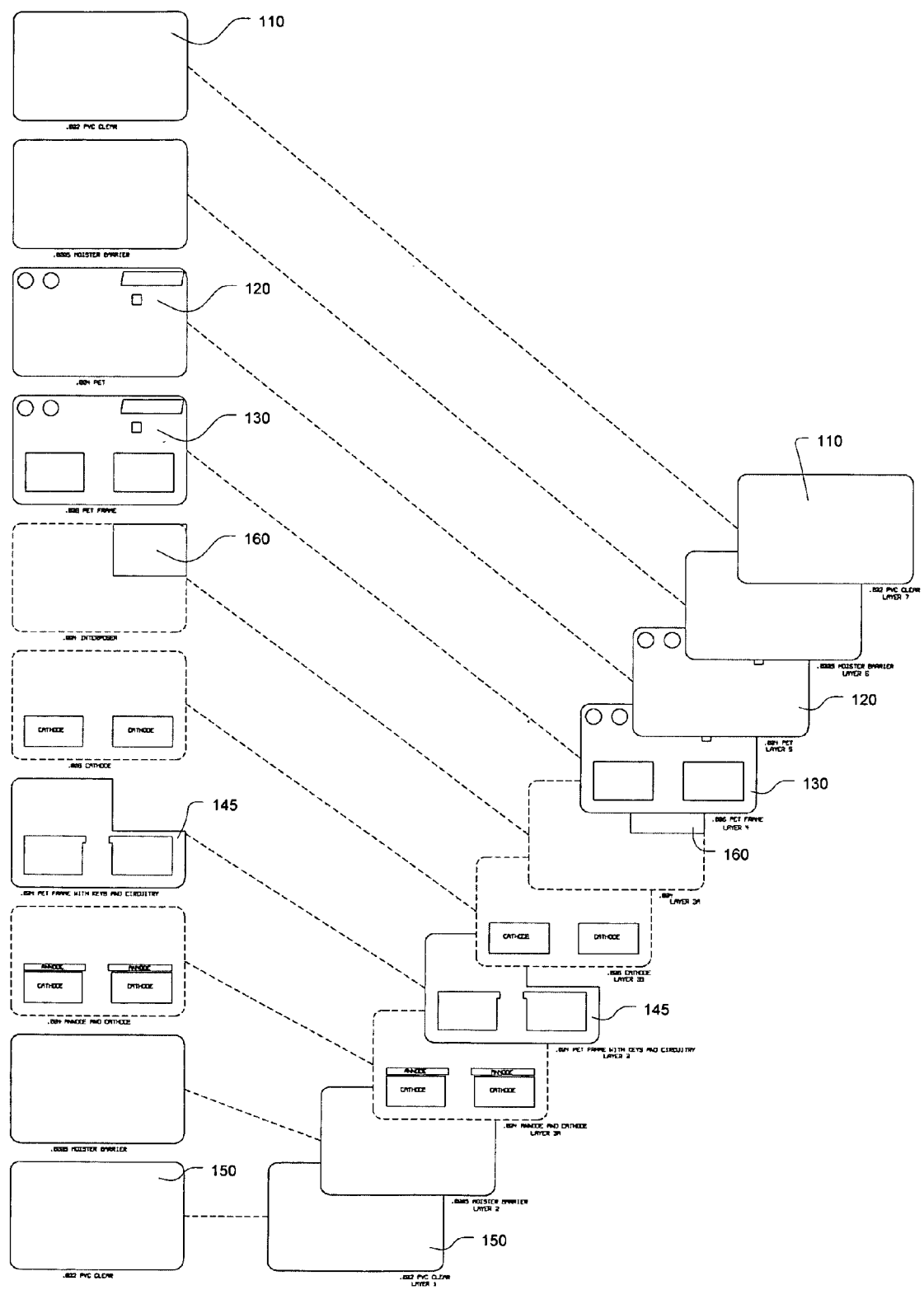
FIG. 5 is schematic exploded view of another structure for the present invention incorporating the display cell and a printed battery.

When the application is a financial transaction card, or other cards which meet ISO standards, these sheets are not the final outer layers of the card provided to consumers or others. Rather, they are covered by a graphics layer and may include clear PVC layers, as seen in FIG. 5. Combining the graphic layers with the outer layers can be accomplished by pre-printing the graphics on the outer layer, which is within the scope of the present invention. In that case, the outer layer is 0.006-0.008 inches. A moisture barrier may be a separate film but is preferably added as uniform coating on the inside layers 110 and 150. When the application is a label, graphic layers may be produced by using graphic inks or other means to hide the inner components.

The moisture barriers are introduced as separate layers when the power source is printed and the electronic core functions as the battery packaging. The barrier coating is intended to preserve the battery chemistry and prevents moisture escape from the battery electrolyte to the environment. Without a moisture barrier, the battery would lose moisture over time resulting in degradation of the battery performance. Acceptable barrier coatings are well known in the art and include aluminum metallization, foils, and other specialized coatings applied to the films. Although reference is made to the "moisture" barrier, this encompasses a barrier for any volatile useful to the batter reaction that impairs the battery's function if it escapes. Pre-packaged batteries have the barrier coating incorporated in the battery packaging and therefore do not require addition of barrier coatings.

The Display Cell

Figure 12:
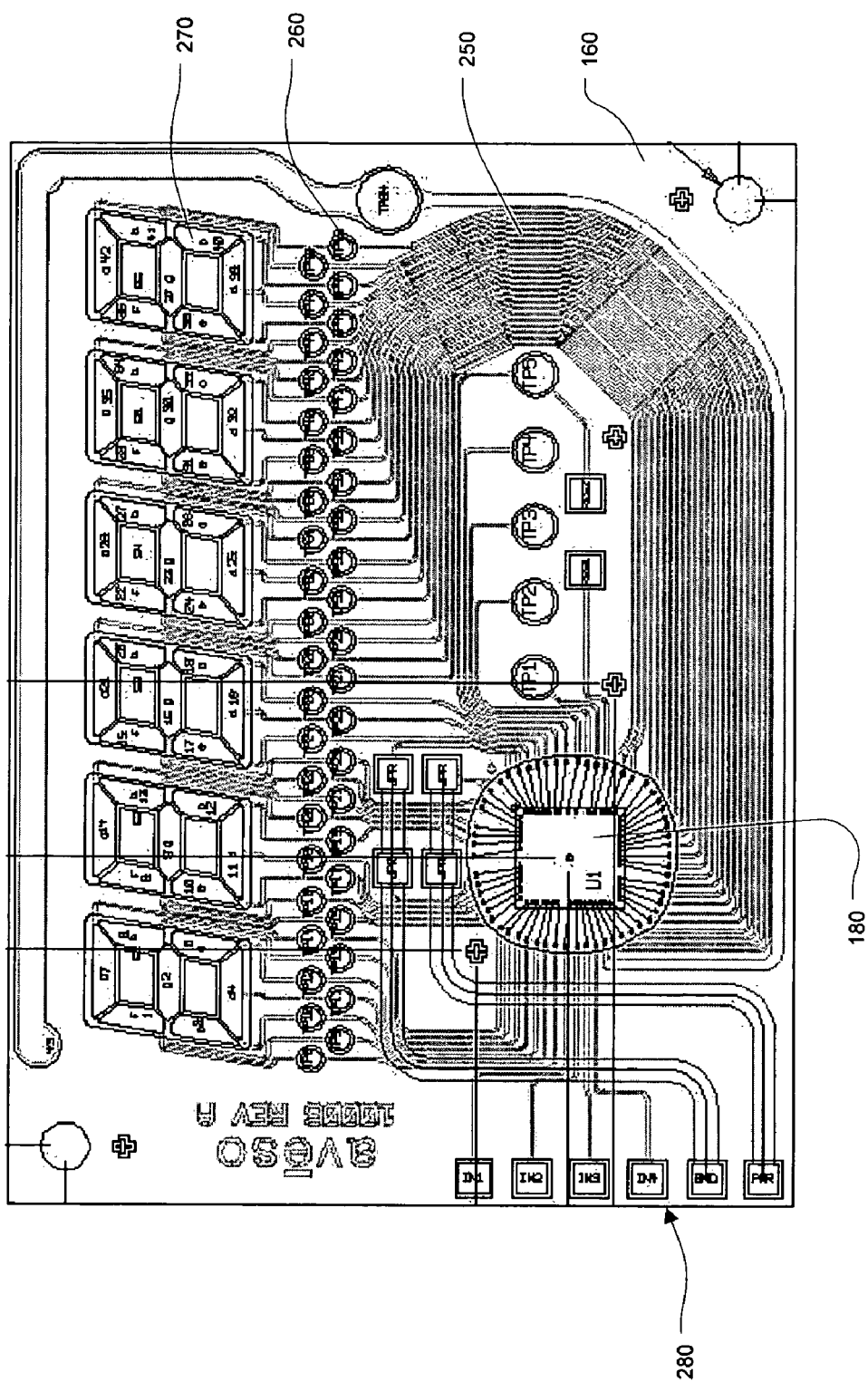
FIG. 12 is a schematic top view of the display cell 160 as in FIG. 2B.

One aspect of the present structure is the use of a display cell 160, including the display 170 and the drive IC 180 on a prepared substrate 140. The display cell 160 is situated on a flex circuit layer 140 as seen in FIG. 3. As seen in FIG. 12, the typical display cell 160 includes an etched copper flexible circuit produced on flex circuit layer 140 through techniques well known in the art. Copper flex provides the trace resolution necessary for attachment to IC 180 with attach pads very tightly spaced. The attach pads on typical ICs vary in size and spacing from 0.002 inch pads with 0.002 inch spacing between pads up to 0.005 inch pads with 0.005 inch spaces between pads. The trend in the semiconductor industry is to continue to shrink both the size and distance between pads. Etched copper flexible circuits are well known in the art and can produce the required line spacing. In addition, etched metal sputtered films can also function as the required display circuit and die attach substrate. The requirements for suitable blackplane materials are trace resolution of a minimum of 2 mil lines and spacing, suitable adhesion to the IC during the attach process, and resistance of less than 100 ohms per square per mil.

The display cell 160 thus incorporates two types of components (other than film or sheet materials) that at present are produced by processes other than printing and that will be required as inputs to the printing and lamination process described. The first type of component is the ICs, which currently require special clean room production facilities. The second is the etched copper flexible substrate. The copper substrate for the display cell 160 of the present invention is produced by first etching the backplane, seen in FIG. 1, a conductive, foil-coated substrate which is well known in the art and is commonly referred as copper flex by those skilled in the art. The backplane contains the pixel traces 250 serving as electrodes for the display, the attach area for the IC 180 and interconnections for the pixel traces to the drive IC. Inputs leads for the drive ICs are brought to one edge 280 of the display cell 160 for subsequent attachment to the remaining circuit elements in the electronic core substrate.

As used herein, a "pixel" for display cell 160 means any display element of any geometric shape, such as display elements 260 and 270, that is individually electrically controllable. Thus, a pixel display element may be in the form of a circle, a square, an elongated polygon or any other shape useful for forming an image character with other pixels or any shape comprising by itself an icon or character. The electrical control of the pixel may be accomplished by providing a dedicated I/O on the IC, or by providing row and column addressing, such as passive matrix or multiplexing circuit design.

The display portion 170 of the display cell 160 is assembled over the pixel traces 250 by printing the electrochromic ink, printing an adhesive gasket, and laminating the clear conductive layer on the patterned backplane to complete the display structure. The display drive IC 180 is then attached using a variety of techniques such as flip chip or wire bounding techniques, which are well known in the art. The display cells 160 are typically created in adjacent rectangles on a sheet or roll containing multiple replications of the etched copper pattern. Each display cell, after receiving its IC, is then singulated into individual parts that become inputs to the printing and lamination process.

A variety of traditional printing processes may be used to create the display 170, including a screen process, a stencil process, a flexographic process, a gravure process, or any combination of processes. The preferable printing process is screen printing by either flatbed methods or rotary methods. The inks used are electrochromic inks as described in U.S. Pat. No. 6,879,424. Further details concerning the structure of the display cell are found in U.S. patent application Ser. No. 11/029,201, filed Jan. 4, 2005, and titled "Universal Display Module," which is incorporated herein by reference.

An exemplary printed universal display module is illustrated in FIG. 1 and generally identified with the reference numeral 20. The universal display module 20 includes a backplane 25 consisting of a backplane substrate 22 patterned with backplane circuitry 24, which may include at least one electrode, an electrically conductive and transparent top plane substrate 26, a top plane conductive layer 28 which may include at least one electrode, a display 30 and a pair of spacers 32 and 34. Alternatively, the electrodes may be formed in a spaced part side by side relationship on either the top plane or the backplane. The universal display module 20 also includes an adhesive gasket (not shown), for sealing the top plane 26 to the backplane 24. The top plane 26 and backplane 24 are also shorted together, for example, with a conductive epoxy (not shown).

Power Sources

The IC chip 180 and other electronic components require power in order to perform processing or other functions. A variety of power sources may be provided in the electrical core structure, such as a rectifier with an RF antenna attached thereto that is used to absorb energy emitted from external sources for wirelessly powering the electronic elements. Another power source is one or more photoelectric cells, which may be placed on a core structure layer that is reached by ambient light. A further possible power source is a battery 190 embedded in the core structure. In all cases the power source is typically connected to the IC chip 180 at power input traces on the layer where the IC is mounted.

Suitable batteries for use in smart cards require a thin form factor. Such batteries are generally known in the art and are conventionally based on either lithium technology or carbon zinc chemistry. An example of a suitable pre-packaged lithium battery is available from Solicore Inc. of Lakeland, Fla. as part number FP252903M002. A suitable pre-packaged battery based on carbon zinc chemistry is available from Thin Battery Technology of Cleveland, Ohio under part number 1-1-ZC. Other thin battery technologies are also known, based on solid state constructions or other electrochemical systems. The power source for the present invention may be composed of either primary or secondary cells. Storage devices such as super capacitors can be utilized in combination with a charging means through a reader. The typical requirements for suitable power sources for conventional IC's and other components is a potential of at least 1.5 volts, a capacity of at least 5 milli-amp-hours, with the core structure imposing a maximum thickness of 0.016".

The batteries produced as pre-packaged units can be incorporated into the electronic core of the present invention. The overall thickness of batteries as produced range from 0.012 to 0.016 inches. A pre-packaged battery 190 may be inserted and embedded into structure 100 between flexible base sheet 150 and flexible top sheet 110. Alternatively, chemical components of battery 190 may be placed on the laminated structure 100 by depositing the materials comprising the battery's layers and features by various known printing techniques, including traditional screen printing, flexographic printing, or gravure printing.

The energy derived from batteries is a result of a chemical reaction within the cell. The capacity of the battery and the power available is a strong function of the quantity of the battery material available for reaction. To a large extent, this can be thought of as a volume of materials. Because in card structures the available area is largely fixed, the desire to maximize battery material volume corresponds to a desire to maximize thickness.

Batteries require packaging to contain the battery materials and to maintain the appropriate level of electrolyte (which may be susceptible to evaporation). In the case of thin form factor batteries inserted into structure 100, the packaging is in the form of pre-packaged films that encase the material. The packaging films are typically 0.003 to 0.005 inches thick, which translates into 0.006 to 0.010 of total battery thickness as a result of the necessary packaging. In the case where battery 190 is printed into structure 100, the present invention utilizes the layers or films comprising the electronic core to encase the battery, rather than traditional battery packaging materials.

Figure 14:
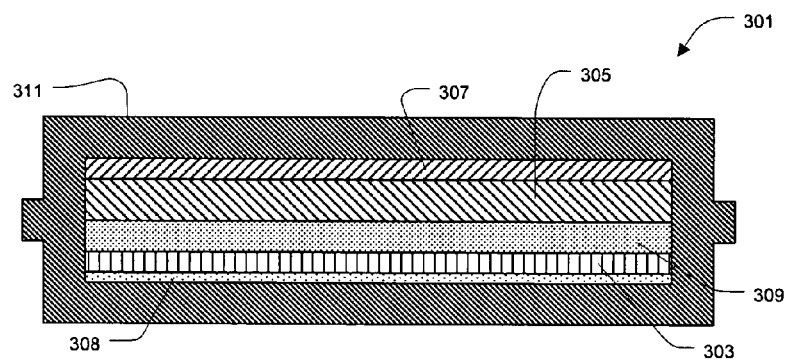
FIG. 14 is a cross sectional view of an electrochemical cell.

In one known method of battery printing, as seen in FIG. 14, components of a pre-packaged thin flexible printed battery 301 include a printed anode 303, a printed cathode 305, a cathode current collector 307, anode current collector 308, separator 309, and an aqueous electrolyte within the separator, all contained within a flexible thin battery package housing 311. The cathode assembly of a carbon zinc cell includes cathode current collector 307 and electrolytic manganese dioxide, active material 305, which are printed onto a flexible sheet to which the cathode current collector ink will adhere with minimal or no cracking. The current collector 307 is deposited onto the flexible sheet using a stencil, a screen, or other suitable printing apparatus. The cathode current collector ink may be an ink formulated from materials sufficient to transfer electrons generated in the reduction of the cathode during discharge. In a carbon zinc cell using an electrolytic manganese dioxide cathode, the cathode current collector is preferably a carbon ink. The printed collector is then subjected to suitable curing to assure adequate drying and solvent evaporation. As seen in FIG. 14, known methods of thin battery printing still result in a substantial proportion of the battery thickness being packaging or housing 311.

In the present invention, the printing line used for other aspects of the core structure can also be used to place battery materials during building of the core structure. By using films that are part of the electronic core structure to replace the packaging films of a pre-packaged battery seen in FIG. 14, additional volume is available to either increase the battery capacity or reduce the overall nominal thickness of the battery. One embodiment of the present invention is to eliminate additional packaging films by building the battery materials into the electronic core structure during film layer assembly.

Figure 13:
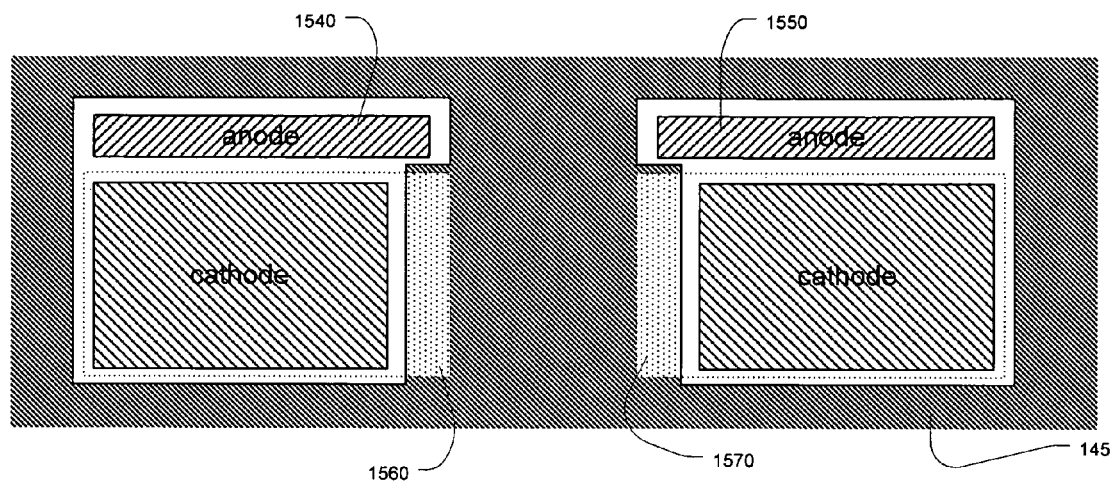
FIG. 13 is a schematic view of electrochemical cells of the present invention.
Figure 17:
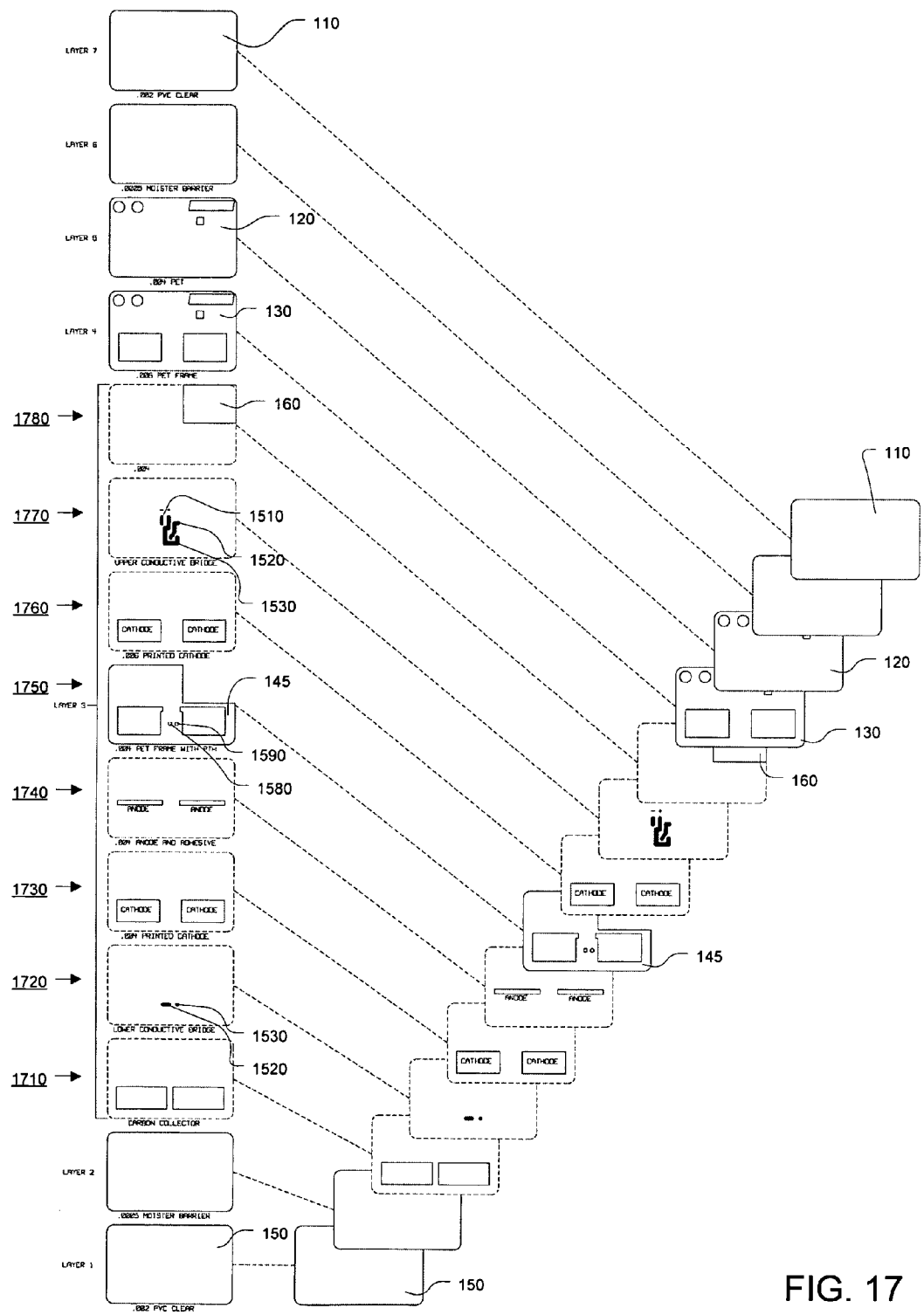
FIG. 17 is schematic exploded view of another structure in an embodiment of the present invention that incorporates more than one battery and provides battery interconnection.

In accordance with the present invention, batteries may be printed and embedded during construction of the core structure in several steps. FIG. 17 shows the construction steps 1710-1780 of embedded batteries according to one embodiment shown in FIG. 13. The method in one embodiment utilizes a screen printing processes. The first step includes the production of the current collectors for the anode and cathode. In the case of carbon zinc chemistry, the cathode current collector is comprised of conductive carbon. The current collector is printed on layer 110 or 150. At step 1710, the current collector is shown being printed on base layer 150. The anode current collector is formed by either a suitable conductive coating or by use of a conductive foil. The interconnecting circuitry between the anode and cathode and between cells is formed using conductive silver ink such as Spraylat XCM-015 from Spraylat Corp. of Pelham, N.Y., which is printed at steps 1720 and 1770. The cathode material is then printed to match the height of core layer 145 at step 1730. The anode is formed by placing material up to the height of core layer 145 at step 1740. At step 1750, core layer 145 is laminated to base sheet 150 using a minor buffer layer, which is described in more detail herein.

Electrical components such as display cell 160 are placed in the core at step 1780, and electrical interconnects between the electronic components and battery are formed. If desired, additional cathode material may be printed at step 1760 of the assembly to add battery capacity. The additional cathode material should not exceed the thickness of core layer 130. Once the desired cathode height has been printed, core layer 130 is laminated to core layer 145 using a minor buffer layer. This process effectively yields a printed battery contained in a well formed by the various core layers. The battery is completed by addition of the battery electrolyte to the formed well and addition of a separator sheet, if desired. The electrolyte may be injected through either printing or non-printing methods. Alternatively, water with a suitable viscosity agent causing it to gel may be injected. In a side-by-side configuration, the separator sheet wets the cell and holds the electrolyte in place. In a co-facial configuration, the separator functions both to hold the electrolyte in place and to separate the anode from the cathode. The battery materials placed are then sealed through lamination of core layer 120 to seal the cell.

Those skilled in the art will recognize that a variety of cell geometries may be used to form the anode and cathode of the battery. It is also recognized that cells may be produced and connected in series to increase the voltage of the power source. The cell geometries can vary by producing the anode and cathode in a side-by-side geometry (on one surface of a layer) or by producing a co-facial geometry by printing the anode and cathode on opposing faces of separate layers and using a separator sheet between the opposed faces to complete the cell.

In the case of lithium cells, the anode is formed by sputtering a lithium metal on base sheet 150 in the desired form. The inter-connects are formed in the same manner as the previous example using conductive silver printed using a suitable process such as the screen printing process. The cathode is printed on core layer 150 using a similar layered approach to form the electrolyte well, constructed of core layers 130, 140, and 145.

In the zinc cell, the anode maintains conductivity during the discharge even though the zinc is being consumed. The anode tab that forms the negative terminal external to the housing is directly connected with the zinc ink rather than being in electrical contact with a distinct anode collector. In the case of screen printing, the optimum mesh opening for printability of the ink is determined. Factors to consider in this determination include the particle size of the zinc, the ink viscosity, and other flow properties under shear and the required thickness of the ink necessary to achieve sufficient capacity. Other suitable sources of zinc metal include zinc foil or zinc mesh, which would act as the battery anode. The material, such as zinc foil, may be deposited during the battery construction by being placed in the structure as part of a pick-and-place line.

For co-facial electrode assemblies, a separator 309 is included to electrically isolate the electrodes while still enabling the flow of ions. As used herein, "co-facial" electrodes share an interfacial area between a major anode surface and a major cathode surface, which are on opposed facing surfaces of core layers. (Co-facial electrodes are to be distinguished from side-by-side electrodes, where a major anode assembly (anode plus collector, if any) surface and a major cathode assembly (cathode plus collector, if any) surface lie approximately in the same plane and are printed directly or indirectly onto a single piece of substrate material.) The separator 309 between anode and cathode layers can be a paper separator, a gelled separator or a printed separator. In a carbon zinc embodiment, using an electrode assembly with a co-facial arrangement, a coated kraft paper separator may be utilized as a separator. For a carbon zinc cell embodiment according to the within invention, the electrolyte is preferably an aqueous solution of zinc chloride that saturates the separator.

Contacts from the printed battery to the input traces that lead to IC chip 180 may also be formed in the printing process. In one embodiment (not shown), the current collector for an electrode extends laterally into a sealing area, while a second metallic external terminal extends into sealing area and contacts the current collector within the sealing area. In this embodiment, electrical conductivity for current flow is provided by the physical contact between the internal current collector and the external terminal. In another embodiment (not shown), the current collector and external terminal are not in physical contact. Rather, electrical conductivity is provided by an electrically conductive adhesive or epoxy located at least in part within the seal area and bridging the two structures. The electrical contacts of the anode and cathode are physically separated from the electrolyte by providing the contact extending outside the lateral seal of the battery. Those skilled in the art will appreciate that other contact arrangements may be implemented.

The anode and cathode external terminals or contacts are preferably printed onto a flexible nonconductive polymer substrate with a silver based conductive polymer ink. The cathode collector is printed onto the external cathode contact so that the collector and the external contact overlap in at least the seal area of the cell package or container. In the same manner, the anode ink is printed onto the external anode contact so that the anode and the external contact overlap in at least the seal area of the cell package or container.

The cathode current collector shape is selected so as to allow for sufficient contact with the cathode ink, and preferably also forms an area that will overlap a portion of the cathode tab in the seal area. The current collector ink is dried and then the cathode ink is printed onto the current collector and dried. A separator 309 is then disposed between the anode 303 and cathode 305 in the case of electrodes in a co-facial arrangement.

Electrolyte is introduced into the battery structure by a variety of means. In one embodiment the method includes a dispensing system that dispenses a predetermined volume of liquid electrolyte into a well formed by the core construction. The well is formed by base layer 150 and the die-cut openings in intermediate layers 145, 130, and 120. The total height of the well is approximately 10-14 mils dependent upon of the thickness of the films for layers 145, 130, and 120. The buffer layers between layers 150/145, 145/130, 130/120 provide the battery seal and prevent leakage of electrolyte between the layers. During hot lamination, the battery layers and buffer layers become fused to provide the battery with a seal with high integrity. If necessary, a separator sheet may be used that provides enhanced wetting of the cathode and anode. Alternately, the electrolyte may be sufficiently gelled (e.g., by use of suitable viscosity adjusting adhesives that do not substantially affect the chemistry) to allow it to be printed over the anode and cathode using print methods such as screen or stencil printing.

Switches and Other Input Components

Figure 4:
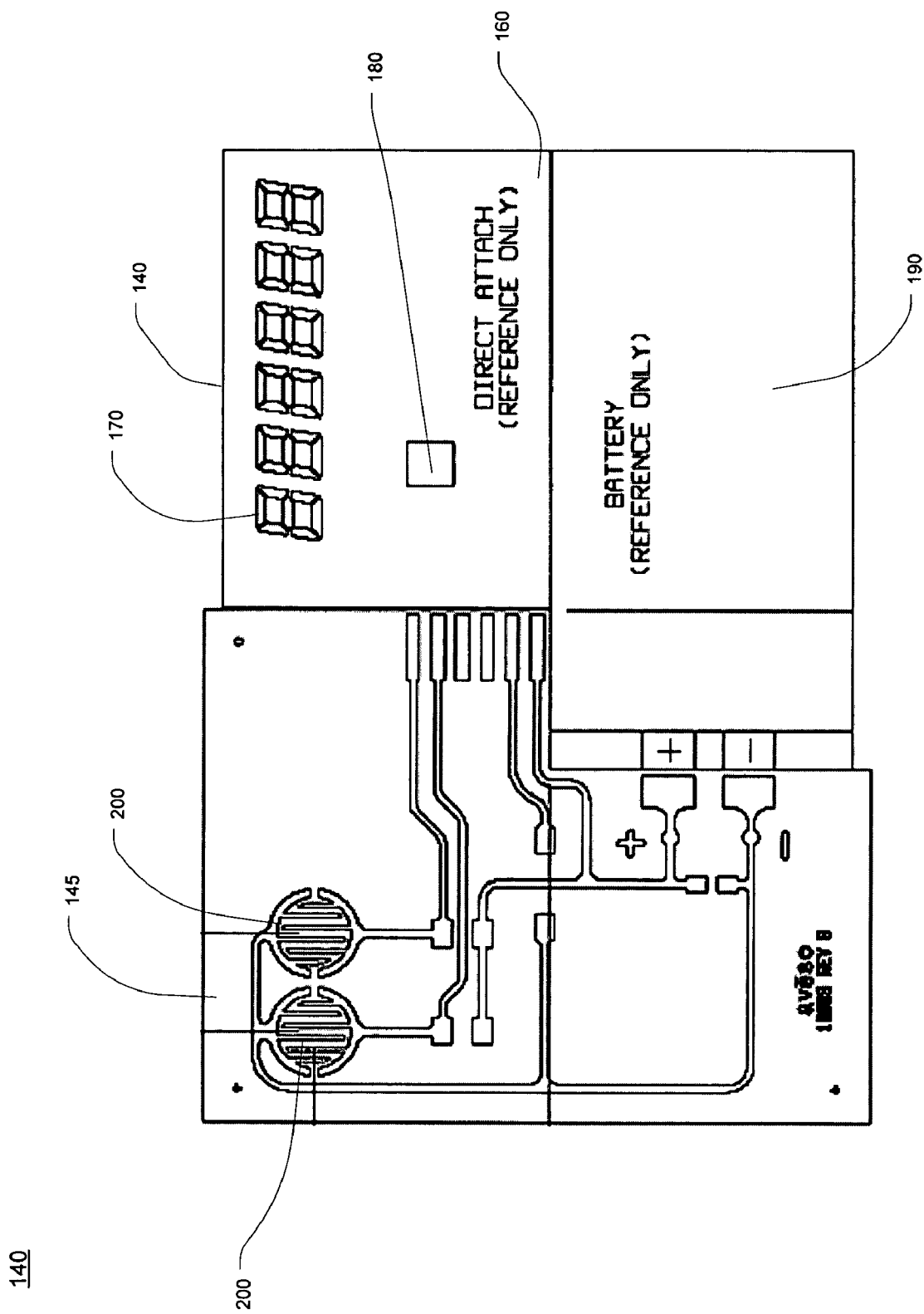
FIG. 4 is a schematic top view of one structure for the present invention incorporating interconnecting circuit-bearing layers 140 and 145 and a pre-packaged battery.

Other electrical components which may be incorporated into the electronic core structure include switch contacts 200, shown in FIG. 4, or other devices, such as sensors, to provide or receive input signals to the IC chips or to complete circuits.

In many applications, a switch may be necessary to activate the electronics and turn on power to the components. Traditional membrane switch technology can be utilized in the present invention. Several varieties of switches are available, such as domed, flat or embossed switches. In the case of domed switches, typically, a metal dome is placed over the circuit that compresses upon actuation. The domes can be hot laminated without damaging or permanently crushing the domes.

Alternatively, the electrical contact pads for the switch are printed on layer 145 or another suitable layer in a pre-determined location and depth in the card. Once hot lamination has been completed, a cavity can be milled to place the dome and the card re-sealed to embed the switch dome. Thus, although the milling is a non-printing process, an electronic core structure may first be produced with the majority of components being printed or incorporated into a printing line. If required for an application, the core may subsequently have a cavity milled or die cut for the dome and still benefit from the efficiencies of the earlier printing process. In the case of flat switches, the switch must be laminated without disrupting the spacer that separates the two halves of the circuit. The preferred domes are six millimeter in diameter with a height of 0.018 inches. A flat switch, which does not contain a dome protruding for tactile feel, is produced by using the various layers, in additional to the layers shown in FIG. 3, as the flex circuit layer, spacer layer, and shorting layer respectively.

Additional or alternative electronic components may be included at layer 145 of the present invention. Although the illustrated embodiment uses a display as an electronic component, other devices such as magnetic stripe emulators, RF antennas, or biometric sensors may be incorporated without deviating from the scope of the present invention.

Printed Layers and Interconnections

The surfaces of the display cell 160 and various containment layers can be used to carry the necessary connecting circuitry for electrical elements. Because structure 100 may include a plurality of layers, each layer, front and back, may be used for circuitry, including printable resistive, dielectric, or other components. Techniques such as through-hole printing may be employed to bring a conductive circuit from one face of a layer to the other. This method is known and is accomplished by providing a via through a film layer that is connected electrically by providing a conductive material through the via. The circuitry may be in the form of conductive traces such as printed silver or other conductive, resistive, or dielectric materials that are known in the art. Thus, with the exception of a few items brought in as pre-assembled, all of the elements and components of the layered structure may either be printed in a printing line or readily added to the printing line. For instance, although IC 180 is currently produced by processes other than printing, installation of IC 180 as part of display cell 160 may be simultaneously performed in the printing line used to form the other layers of the electronic core structure, and the IC is thereby appropriately integrated into the electronic core structure.

The use of printing processes makes it possible to produce the layers with circuit features for many individual structures in sheets and/or rolls in large numbers at high speed and low cost. These pre-formed component layers having electrical traces printed on one or two surfaces thereof can then be singulated and assembled in lamination processes between the base sheet and the top sheet as described below, with locationally mated printed structures and vias providing for appropriate electrical connection between layers and to the display cell 160.

Known processes may be used to print, or build with printed layers, a wide variety of elements such as display pixels, conductive traces, resistors, switches, batteries, capacitors, and conductive adhesive. These elements or their components may be printed onto the top or bottom of any of the described layers, using FIGS. 2A and 3 for reference, including flex circuit layer 140, first cover layer 120, and second cover layer 130, as necessary to make the desired structures and connections. These printable elements may also be printed on additional layers not shown in FIG. 3, as implementing additional layers provides more printable surfaces to facilitate more complicated structures and connections.

For example, with reference to FIGS. 3 and 4, shorting pads may be printed on the top of first cover layer 120 thereby forming a membrane for switch 200. By way of another example, shunts may also be printed in appropriate locations on the bottom of second cover layer 130, which will be adjacent to flex circuit layer 140 upon assembly, to jump the desired circuitry on flex circuit layer 140. A variety of other components may be printed on the bottom of second cover layer 130 to form connections with and components operably connected to flex circuit layer 140, such as electrodes for display 170, resistors, capacitors, and antennas. Additionally, more complicated connections may be formed by printing crossover insulation on portions of desired layers, which allows for subsequent traces to be printed over the same location.

In yet another example, conductive adhesive can be pattern printed, along with non-conductive adhesive, on the bottom of second cover layer 130, such that the conductive adhesive is pattern printed to connect the desired circuitry on flex circuit layer 140 and layer 130. A variety of other printed configurations may also be achieved, including printing capacitors or resistors on the desired layer. These printed elements may alternatively be surface mounted on the desired layer.

Figure 16A:
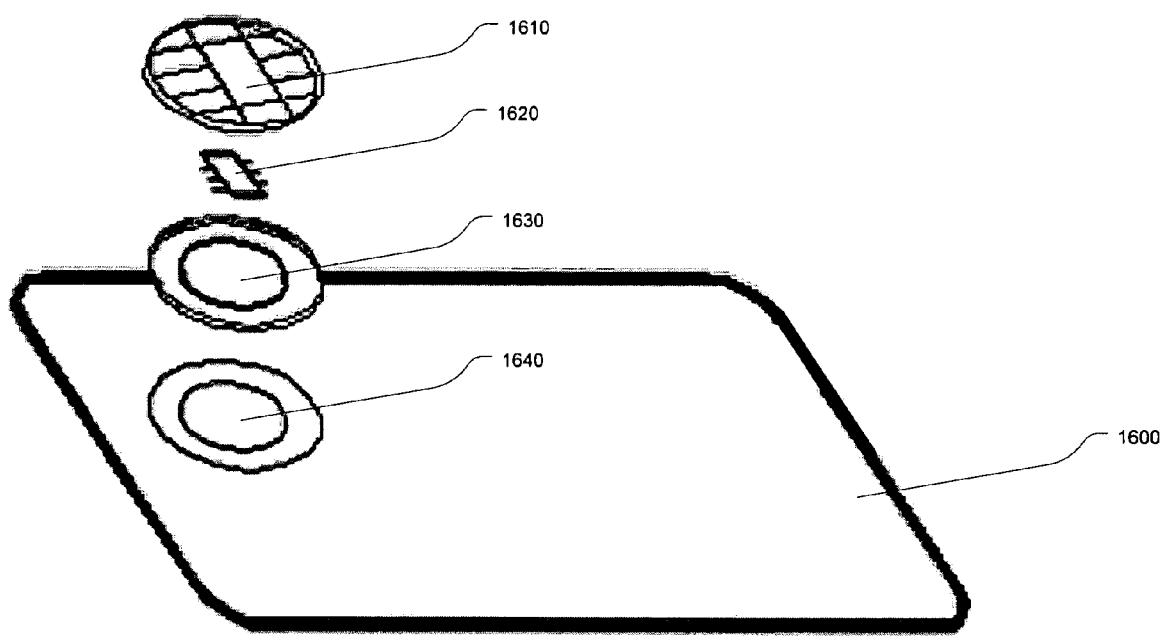
FIG. 16A is a schematic view of the chip plate structure conventional for a smart card.

With reference to FIG. 16A, existing smart card contact cards utilize a chip plate 1610 to form the contact points between the card 1600 and the smart card reader (not shown). A microprocessor 1620 is traditionally attached to the plate 1610 through wire bonding, flip chip, or other conventional die attach methods under the chip plate and attached electrically and physically to house the data, processor, and programming contained on the card. In some embodiments, glue 1630, or another adhesive, and support 1640 are also provided to secure the chip plate 1610 and microprocessor 1620. Contact smart cards do not currently connect the smart card chip to other components in the cards. However, it may be desirable to connect this microprocessor to other electronic components in the card such as a display or biometric sensor. In these cases, printed circuitry on core layer 145 may used to provide the conductive path between a smart card chip plate and the other components, such as IC 180, as described in more detail below.

Battery Interconnection

As previously noted, two or more cells may be produced and connected in series to increase the voltage of the power source. The cell geometries may vary, and with reference to FIG. 15A, in one embodiment two batteries are printed and interconnected in a side by side geometry. The anode 1540 and cathode current collector 1560 of a first battery are situated and the anode 1550 and cathode current collector 1570 of a second battery are printed side by side. To connect these batteries in series, conductive bridge 1510 is electrically connected to anode 1540 of the first battery to form the negative terminal, conductive bridge 1530 is provided from the cathode current collector 1570 of the second battery to form the positive terminal, and conductive bridge 1520 connects the cathode current collector 1560 of the first battery to the anode 1550 of the second battery.

Figure 15A:
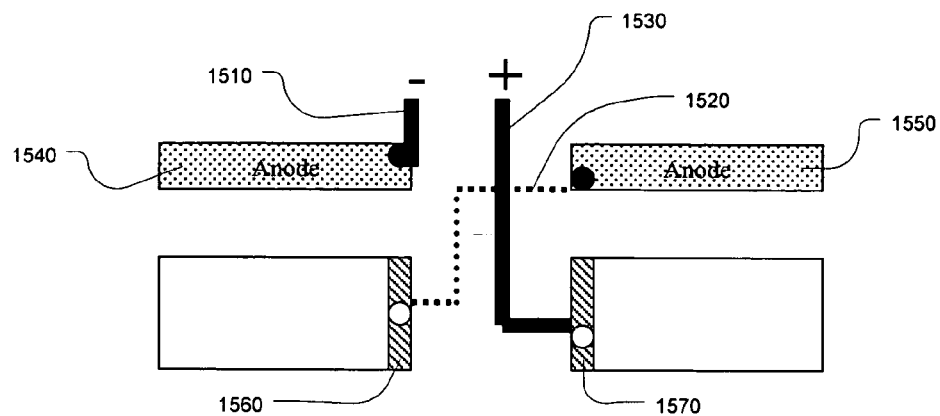
FIGS. 15A and 15B are schematic views of two electrically interconnected electrochemical cells of the present invention.
Figure 15B:
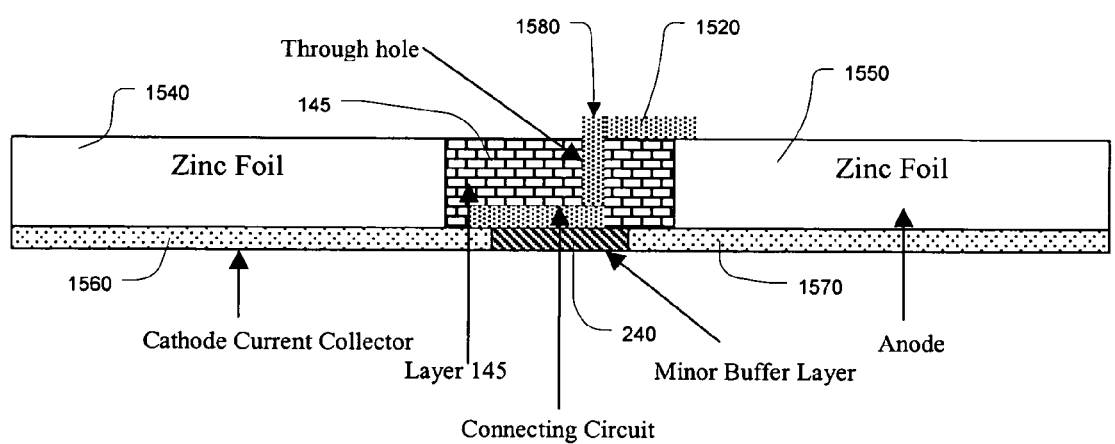

With reference to FIGS. 15A and 15B, it can be seen that conductive bridge 1510, which forms the negative terminal, is led away from anode 1540 to the top of core layer 145. Conductive bridge 1530, which forms the positive terminal, is also led to the top of core layer 145 (not shown in FIG. 15B). To achieve the interconnection between the two cells through core layer 145, a through hole 1580 in core layer 145 is provided. Conductive bridge 1520 connects the cathode current collector 1560 of the first battery, which is below core layer 145, to the anode 1550 of the second battery, which is above core layer 145, by passing through the through hole 1580, as seen in FIG. 15B. Similarly, conductive bridge 1530 is provided from the cathode current collector 1570 of the second battery, which is below core layer 145, to form the positive terminal on top of core layer 145 by passing through the through hole 1590 to the upper surface of core layer 145.

The conductive bridges, 1510, 1520, and 1530, are formed using conductive silver ink such as Spraylat XCM-015. With reference to FIG. 17, steps 1720 and 1770 show the printing of these conductive bridges as part of the core structure building sequence. Through holes 1580 and 1590 are also shown in core layer 145 in FIG. 17, which allow for the conductive ink to create the electrical connections through core layer 145.

The conductive bridges 1510, 1520, and 1530 are described with respect to interconnecting batteries through core layer 145. However, those skilled in the art will appreciate that these principles of leading conductive materials across and through the various layers of the laminated structure may be applied to other electrical components and other layers of the present invention.

Smart Card Processing

In the case of connection to electronic components that already contain a microprocessor such as a microprocessor driving a display, the contact smart card chip may be eliminated from the construction. Again with reference to FIG. 16A, in this embodiment of the present invention the chip plate 1610 is used to provide the standard contact interface for a reader but without the traditional smart card microprocessor 1620 attached to the back of the chip plate. The microprocessor used to control the display or other components serves the dual purpose of hosting the software for element control as well as the software normally housed on the smart chip to communicate with external readers.

Figure 16B:
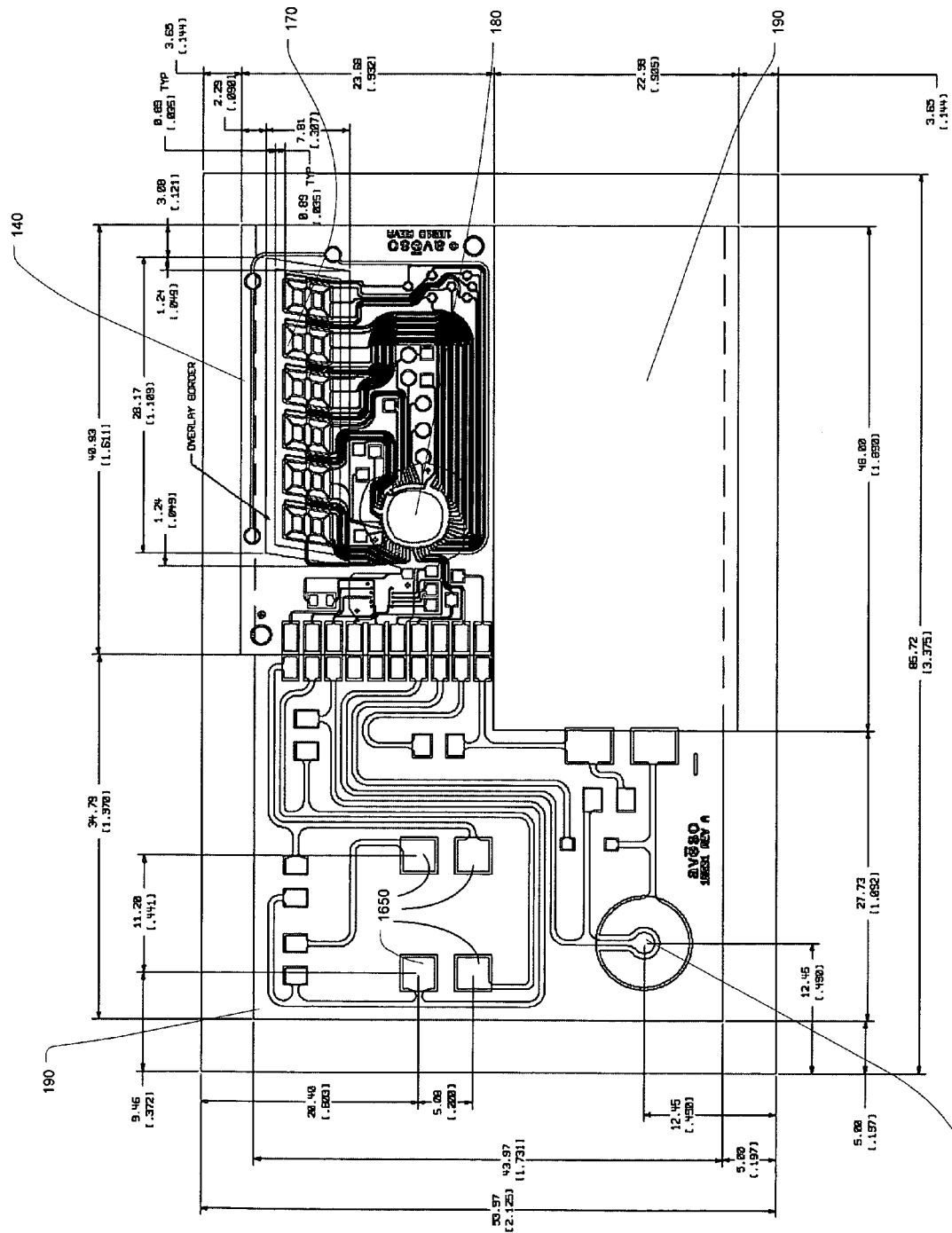
FIG. 16B is a pictoral plan view of the circuitry used in an electronic core in one embodiment of the present invention to provide a smart card with display and consolidation of IC components.

With reference to FIG. 16B, IC 180 may be used to replace the processing currently performed by integrated circuits in existing "smart cards." The physical structure of existing smart cards is specified by the ISO standards 7810, 7816/1 and 7816/2. Generally the structure is made up of two elements: a printed circuit and an integrated circuit chip 180 that is embedded on the card. See FIG. 16B. The chip plate 1610 is in electrical connection with contacts 1650, which allows for the processing functions of IC 180 or signals from switch 1660 to reach the plate 1610 when the chip plate is in a standard reader.

The printed circuit shown in FIG. 16B conforms to ISO standard 7816/3, which provides five connection points for power and data. The chip plate circuit is hermetically fixed in the recess provided on the card and is burned onto the circuit chip, filled with a conductive material, and sealed with contacts protruding. The printed circuit protects the circuit chip from mechanical stress and static electricity. Communication with the chip is accomplished through the "chip plate," which includes contacts that overlay the printed circuit.

The chip plate serves as the contact pads between a card acceptor device (CAD), or card reader, and the integrated circuit chip. The integrated circuit chip provides logic and functions as the communication vehicle between the card and the reader. The chip also contains appropriate cryptographic programs as well as other necessary security programs.

In accordance with the present invention, IC 180 drives display 170. However, it may be desirable to combine the display processing functions of IC 180 with the processing functions of the integrated circuit chip of existing "smart cards." Although the two chips may co-exist in a single card, if the smart chip is required to communicate with another chip such as a display driver IC 180, the data lines are connected through a set of traces. As described, current chip plates have six or eight connections for use with the chip, and they include power and other communication lines.

To avoid the shortcomings of two separate IC's, the display driver IC 180 may be designed to include the same functionality and memory as existing smart card chips. All programming currently on the smart card chips may be included in IC 180, thereby eliminating the second microprocessor. To achieve this, a chip plate conforming to the requirements of the smart card contacts is mounted in an opening in flexible top sheet 110, but there is no associated IC. No other processor, other than IC 180, is required. Appropriate connections may be printed on surfaces of layer 145, second cover layer 130, and/or flex circuit layer 140 from the chip plate to IC 180 and battery 190 to allow the signals for standard smart card protocols to flow to and from IC 180.

Magnetic Stripe Emulator

As described, a variety of electrical components may be included in the core structure of the present invention. One suitable component may be a magnetic stripe emulator such as the device described in U.S. Pat. No. 4,701,601. A card with a magnetic stripe emulator may be used with transaction terminals having a sensor for reading and interfacing a magnetic stripe. The card may include a transducer for generating a varying magnetic field corresponding to information typically encoded on a magnetic stripe. In the case of the present invention, IC 180 extracts transaction data stored in a memory and supplies output signals to the transducer. The transducer generates a varying magnetic field corresponding to the transaction information which is read by the sensor in the transaction terminal. This produces a core structure that includes magnetic stripe emulation for card applications.

Biometric Sensors

Another electrical component that may be incorporated into the present invention is any one of a variety of biometric sensors. In one embodiment, the biometric sensor is a micropressure sensor designed to support fingerprint image capturing. An example of one such suitable sensor is the Fidelica Image Sensor model 3002 from Fidelica Microsystems, Inc. of Milpitas, Calif., which may be embedded into microprocessor based devices. When integrated with applicable host components, the sensor may allow users to perform a variety of electronic authentication security functions. Again, the core structure of the present invention can include this feature where it is required or desirable for a card application.

Buffer Layers

Because of the varying dimensional nature of the different components and films and because of the variations arising among different examples of individual components and the ISO requirements of flatness for the resulting card, the assembly of structure 100 includes buffering layers. These formable layers provide equalization among various components and allow a specific dimension "H" to be achieved in the electronic core structure as measured from the outside of the base sheet 150 to the outside of the top sheet 110 (see FIG. 2A).

A flowable buffer material such as an adhesive is applied between two or more of the layers in structure 100. As described below, the buffering layers adjust for the variation occurring within any production batch of each component and the films. For instance, the height of IC 180 may be non-uniform or outside the desired nominal dimension, but the variation is compensated for the buffering layers. The desired height dimension H is achieved by buffering at multiple layers; as each of the layers of structure 100 are laminated together as describe below, flowable adhesive layers absorb over-dimensions and fill under dimensions for each of the various components and layers. Nip rollers used after buffer application help establish the desired dimensions. Cavities in the web of each die cut layer absorb the flowable adhesive from over-dimensioned elements. The cavities are generally designed to level the various elements such as the IC, battery, and display cell. Because the cavities may not be formed to fit the varying dimensions of the elements exactly, they are slightly over-sized resulting in small cavities around the various elements. The flowable buffer material fills the cavities and provides a uniform structure.

During hot lamination, the resins used to make up the film layers of a core structure flow as well. The cavities formed around the various elements are filled by resin flowing during the hot lamination process. Because the resin fills the voids from the preformed cavities, the result may be unacceptable surface defects such as fissures, cracks, or depressions in the card surface due to the volume lost during the flow process. Thus, the use of a flowable buffer material pre-fills the cavities arising during core formation thereby eliminating the volume deficiencies which would result in such defects.

Two buffer layers are described below, a major buffer layer and a minor buffer layer. These buffer layers may have thicknesses of 1.0 to 3.0 mils and 0.25 to 1.0 mils respectively. The preferred thicknesses are 2.5 mils for a major buffer layer and 0.5 to 1.0 mils for a minor buffer layer.

Figure 6:
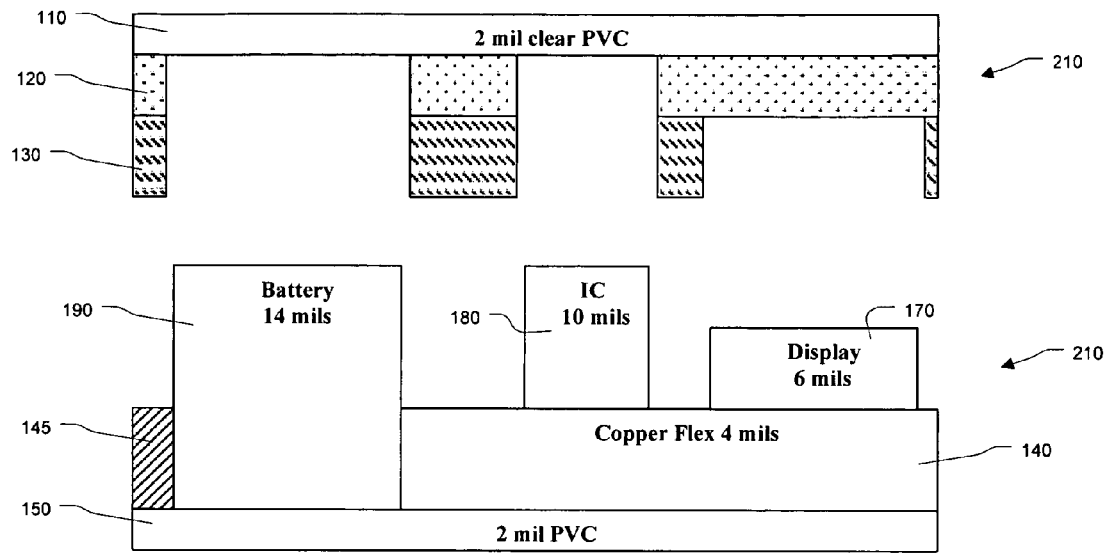
FIG. 6 is a schematic cross-section side view of the partially assembled structure of the present invention as in FIG. 2A.

First, the major buffer layer is described. With reference to FIG. 6, during assembly of structure 100, flexible top sheet 110 is laminated to first cover layer 120, and first cover layer 120 is laminated to second cover layer 130, thereby forming a top assembly layer 210. A base assembly layer 220 is formed by laminating together a plurality of elements and layers, such as base sheet 150, display cell 160 with display 170 and IC 180, and battery 190, shown in FIG. 6. These elements are laminated with conventional lamination techniques, using nip rollers to achieve the desired thickness of top assembly layer 210 and base assembly layer 220.

Figure 7:
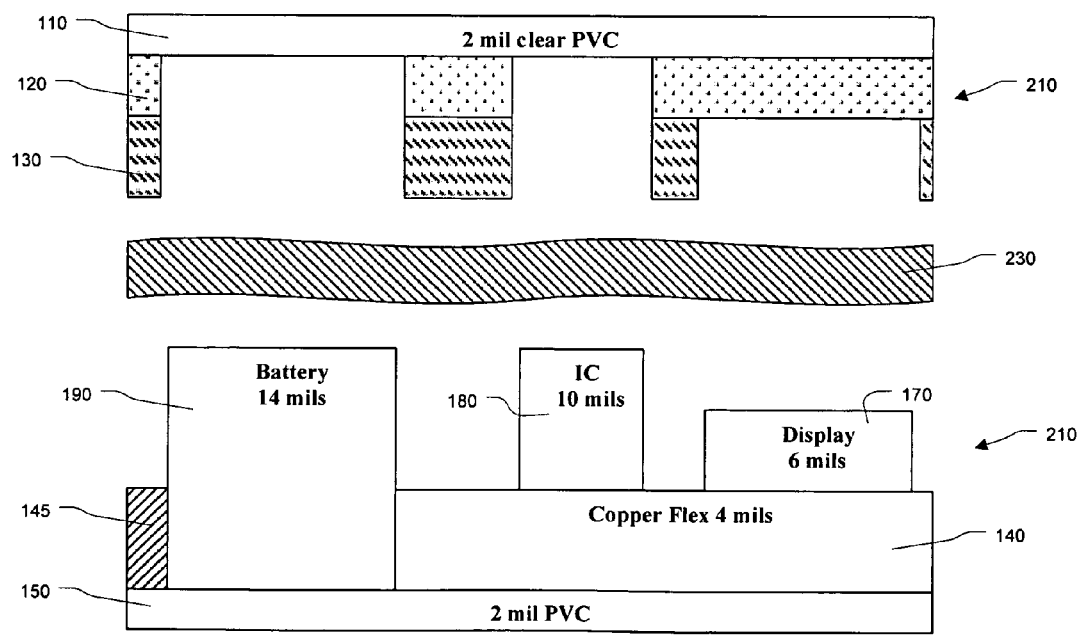
FIG. 7 is a schematic cross-section exploded side view of the partially assembled structure of the present invention as in FIG. 2A with a major buffer layer shown between a top assembly layer and a base assembly layer.
Figure 8:
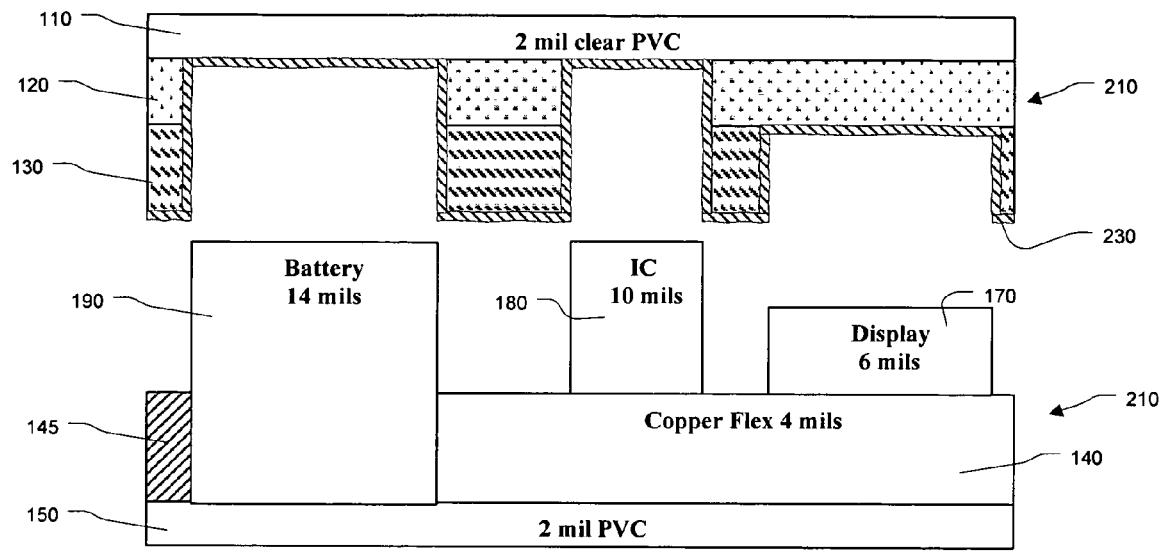
FIG. 8 is a schematic cross-section exploded side view of the partially assembled structure of the present invention as in FIG. 2A with the major buffer layer shown applied to the top assembly layer.

As discussed, undesirable dimensional variations will arise in the laminated elements in these layers. With reference to FIG. 7, a major buffer layer 230 may be situated between top assembly layer 210 and base assembly layer 220 to substantially level out the variations and achieve an acceptable dimension. Major buffer layer 230 may be formed with a laminating adhesive that is flowed over top assembly layer 210, as shown in FIG. 8. The major buffer layer 230 may be applied to the top assembly layer 210 by a variety of methods, including screen, stencil, pad, or flexographic printing. These printing processes may be accomplished with a plate that has contours mirroring the contours of the top assembly layer 210. The plate is matched up with the corresponding location on the top assembly layer 210 to supply sufficient coverage of the adhesive into the recesses of the top assembly layer 210. Thus, although FIG. 7 for simplicity shows a buffer layer 230 of uniform thickness, this layer as applied by the above methods will have a pattern of material thickness and volume selected to deliver more material to locations where reservoirs of flowable material are needed to migrate into cavities. The major buffer layer provides sufficient buffer material to insure that dimensional disparities and voids formed during core formation are compensated for and filled.

Figure 9:
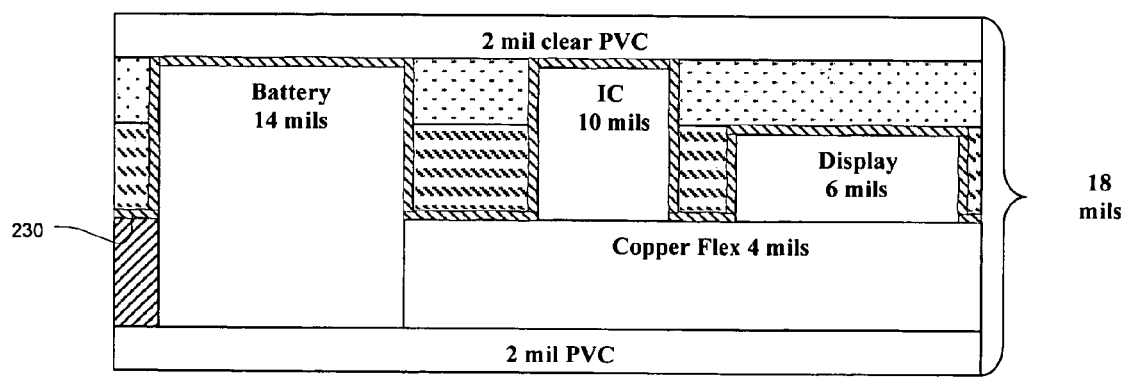
FIG. 9 is a schematic cross-section side view of the assembled structure of the present invention as in 2A incorporating a major buffer layer.

With reference to FIG. 9, top assembly layer 210 and base assembly layer 220 are merged, and a patterned major buffer layer 230 absorbs over-dimensions and fills under dimensions in the various components, thereby making up height variances to achieve the desired height dimension as determined by nip rollers. Any excess buffer material is allowed to seep out the edges of the cover sheets and is subsequently trimmed to form the desired shape.

The use of buffer layers may also provide desirable mechanical strength to the resulting electronic core structure. By providing a substantially solid construction to assemble the various elements and cavities, the resulting core structure exhibits highly desirable stiffness and mechanical integrity. Furthermore, the use of buffer layers to lock the various layers together increases the electrical integrity of interconnected electronic circuits. Suitable buffer layer material should have the desired viscosity or other physical characteristics to allow for its application by printing processes, and it should be flowable and curable such that it assists in holding core structure layers together. However, the buffer material does not need to be a permanent adhesive. The buffer layer material should also blend with the PVC or other layers and any additional printed materials during the hot lamination process such that the buffer material is compatible with the resins of the film layers and electrical components in a melt state. A variety of material families are suitable as the buffer material, such as acrylates, urethanes, plastisols, polyesters, or other similar materials of suitable viscosity for printing and strength following curing.

Figure 10:
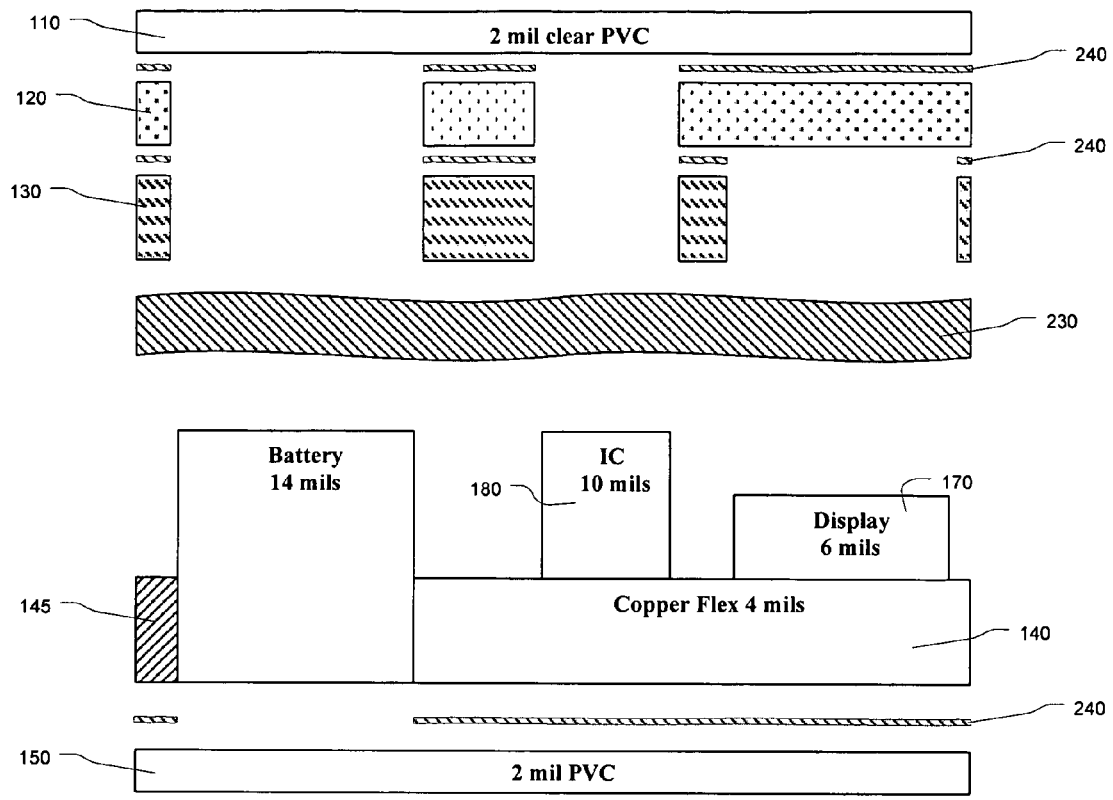
FIG. 10 is a schematic cross-section exploded side view of the partially assembled structure of the present invention as in FIG. 2A with a major buffer layer and minor buffer layers shown between the layers of the structure.
Figure 11:
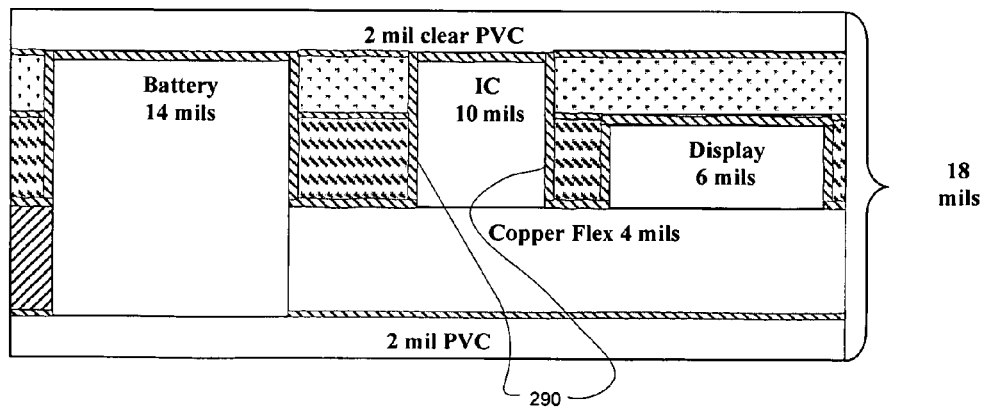
FIG. 11 is a schematic cross-section side view of the assembled structure of the present invention as in 2A incorporating a major buffer layer and minor buffer layers.

In addition to major buffer layer 230 adhered to flex circuit layer 140, a plurality of minor buffer layers 240 may also be flowed and adhered between the other layers, as shown in FIGS. 10 and 11. This allows the desired height dimension to be achieved by compensating buffering at multiple layers in structure 100. The minor buffer layers also function to adhere the various layers together during manufacturing. Finally, minor buffer layers and intermediate nip rollers permit a given structure to be placed reproducibly at a known distance from the top or bottom of the substrate. This can be important if in a particular application the end user desires to use milling or other processes to connect to any elements embedded in the core structure.

In addition to equalizing the height dimension of the various components and layers, major buffer layer 230 and minor buffer layers 240 can correct other dimensioning issues. For instance, where a layer to be laminated is die cut to fit IC 180, there may be "over-cutting" to allow the structure to easily receive an IC. The variation in "over-cutting" that occurs one electronic core structure to another is distinct from the variation in IC size. Although the ICs' shape may be formed with acceptable dimensions, their placement on structure 100 may vary, leading to positional variations that need compensation. Accordingly, after a chip is mounted to the structure and a die cut layer applied around it, a cavity may be formed therearound. In this case, the buffer layers will not only fill in height variations of the IC, but they will also fill in the cavity volumes 290 around IC 180, as seen in FIG. 11.

EXAMPLE 1

Discrete Component Placement and Multilayered Circuit

Consistent with the teachings above, the invention will now be illustrated in a construction with two composite layers, a base layer 220 and cover layer 210, shown in FIG. 6, which are then laminated together to form the core electronic structure.

The electronic core is constructed by placing the necessary components on a base sheet 150 in the proper configuration for the part layout. The base sheet may be PVC or other film which will laminate to outside layers through the hot lamination process. The thickness of the base sheet will preferably be in the range of 0.001 to 0.005 inches with a preferred thickness of 0.002 inches. The various components are held in place with a thin layer of pressure sensitive adhesive.

The components placed on the base sheet 150 include membrane switch domes, the battery and display cell. The initial component placement determines the spacing of the relief areas as well as the various heights requiring leveling. It is desirable, but not required, to pre-laminate die cut layer 145 which matches the substrate thickness of the display cell and battery tabs. The surface of the substrate may contain the switch base circuitry on which the domes will be placed.

The preferred method of lamination is to use permanent laminating adhesives which cure either through UV radiation, EB radiation or heat. The base layer lamination may be forced through a nip point which sets the height and reduces potential height variation of this layer.

The core now consists of the display cell contacts, battery tabs and switch contacts on the same plane and facing up. Domes may be placed over the switches and adhered using adhesive techniques well known in the art. This completes the base layer 220 which will be subsequently laminated to the cover layer 210.

The cover layer 210 has all necessary connecting circuits printed on the bottom thereof, which will connect the switch, battery and display cell electrical contacts found on the base layer 220. The cover layer is designed to match contours of the display height, chip set, battery and switch domes. The cover layer may be built in a three dimensional form by laminating films with die cuts to match the topography of the base layer, or "component layer." The cover layer has a minimum number of sub-layers based on the number of elements of differing height placed on the base layer. The cover layer may be constructed of clear films that allow the display embedded in the core to be viewed.

The final assembly step is to laminate base layer 220 and cover layer 210 using permanent laminating adhesive. A buffering layer 230 of 0.001 to 0.002 inches of flowable adhesive is use the bond the cover layer to the base layer and the entire structure is passed through a solid nip point set at 0.018 inches prior to fusing the adhesive. The adhesive is applied either through screen printing, pad printing, dispensing, or spraying. The three dimensional structure should be entirely covered and the electrical contact areas should be free of adhesive.

The final laminating adhesive is permanent and can be chosen from the family of radiation cured adhesives such as UV or EB which are cured through the clear cover layer. Alternatively, a permanent hot melt may be applied, which is chilled through the nip point. The hot melt has the additional benefit of reflow during the hot lamination step of producing the finished card. All buffer layers should consist of adhesives that do not interfere with the hot lamination process by preventing the various layers from fusing permanently and the resulting card must pass ISO specifications. One such adhesive suitable for the application is Radcure UV-170-SP.

The materials of base sheet 150 and top film 110 are constructed of PVC or other plastics suitable for hot lamination. Alternatively, a heat seal such as polyvinylalcohol (PVA) or other commercial heat seal coatings could be coated on the outermost surfaces to insure the proper bonding of the finishing surfaces during hot lamination.

EXAMPLE 2

Planar Circuit and Electrical Connects

In another example, the construction of base layer 220 is modified by printing the entire connecting circuit on the top of the structure which will match up with the connection points of the display cell and battery components and contain the base for the switches. Electrical connection between the connecting circuit and the components is then provided through needle dispensing to provide a conductive path to each connection. The remaining structure remains the same as Example 1.

Examples 1 and 2 illustrate the inherent flexibility of printing circuitry within the electronic core. The electronic core will typically have 5-7 discrete surfaces to print circuit elements prior to final assembly. This embodiment of the invention provides the capability to layer the circuitry within the core and use all available surfaces to fit the necessary circuits. This is useful when elaborate circuits must be contained within the area available for a smart card. This effectively provides 5-7 times the capability over a conventional single surface.

Electrical connections between layers of the core may be obtained through introduction of conductive via's through the layers. This practice is accomplished by drilling or punching holes through each desired layer in register with the circuits to be connected and filling the holes with a conductive epoxy or other material to provide through-hole circuit paths.

EXAMPLE 3

Embedded Carbon/Zinc Battery

As described, batteries suitable for use in a smart card are typically 0.012 to 0.016 inches in total thickness. Of that total thickness, 0.006 to 0.010 inches are comprised of packaging films to seal the battery. This example illustrates the use of core layers as part of the battery packaging which saves overall thickness and complexity of the core.

This construction is based on the base layer 220/cover layer 210 as described in Example 1. On the base layer, the battery anodes and current collectors are deposited on the top of the second film PVC layer 150. Separately, on the same layer, the cathodes and current collectors are printed as well. The total thickness of the battery layers is 0.006 inches which matches the height of the display. Two separate cells are required to achieve the required 3V from the system. The attach circuitry connects the batteries in series to the other elements.

The cover layer 210 is constructed to have a evacuated area over the battery electrodes to provide relief upon lamination. Prior to final lamination, the battery electrolyte is added to the well to complete the battery construction. Upon lamination, the electrolyte wets the cells to activate them.

EXAMPLE 4

Embedded Lithium Battery

The use of lithium battery chemistry has the advantage of 2.8V per cell which simplifies the construction of the core. However, lithium chemistry requires the assembly of the cell in a dry room environment due to the reactivity of lithium with water.

Therefore, this requires the pre-forming of the battery component prior to incorporation into the core structure. This is accomplished by laminating the copper foil current collector which has lithium metal sputtered to it previously to form the anode to the core film which is 0.010 inches thick. The core film is die cut to the shape of the battery and forms a well. The well is then filled with the electrolyte and cathode material and is sealed with copper foil which forms the cathode current collector. The resulting structure is 0.010 inches and has more capacity than a separate cell with a total thickness of 0.014 inches.

The battery layer described above now has the anode connection on one surface and the cathode connection on the opposite side. Electrical connection to the bottom electrode is produced by bringing the circuit to the bottom electrode. The electrical connection to the top electrode is produced by providing a via through the film and connecting to the back plane using through-hole techniques.

As with other examples, the cover layer and base layers are laminated using buffer layers of 0.001 to 0.002 inches of adhesive as described in Example 1.

EXAMPLE 5

PVC Layers

The core construction can be constructed using a variety of films. By selecting the appropriate laminating adhesive, successful hot lamination does not require that all layers reach the melt point of the film during the lamination process. Alternatively, the layers may be constructed of films which reach the melt point of the selected film and fuse during the lamination process. Suitable films such a polyvinylchloride and polypropylene are well known in the art. The lamination process remains constant except that the laminating adhesives are patterned printed in a waffle or other suitable pattern to allow the layers to flow and provide suitable surfaces to melt into. The laminating process is still used to level the various layers but the primary purpose of the adhesive is to hold the various layers together prior to lamination. In the case of a printed battery, the buffer layer adhesives are printed as a continuous layer around the battery to insure the formation of a gasket to contain the battery electrolyte prior to final lamination. This printing is performed even if a pattern is used in other areas of the card.

CONCLUSION

The above examples illustrate the range and flexibility of the printed and laminated structure of the present invention. In particular, the present invention may be used to produce efficiently an electronic core structure that provides specified electronic functionality of a variety of financial card and other applications, that has the required structural integrity, and that permits finishing layers to be applied while remaining consistent with dimensional requirements, flexibility, and other physical requirements of the particular application, as specified by standards and/or user requirements. Those skilled in the art will recognize that other components and configurations can be practiced and are within the scope of the present invention.

APPENDIX A

Smart Card Specifications

ISO 7810—One of a series of standards describing the characteristics for identification cards as defined in the definitions clause and the use of such cards for international interchange. This International Standard specifies the physical characteristics of identification cards including card materials, construction, characteristics, and dimensions for four sizes of cards. Nominal dimensions for bank cards, including standards for edge burring not to exceed 0.008 mm (0.003 in.), surface distortions and signature panels.

ISO/IEC 7811-1 Identification cards—Recording technique—Part 1: Embossing This part of ISO/IEC 7811 is one of a series of standards describing the parameters for identification cards as defined in the definitions clause and the use of such cards for international interchange. This part of ISO/IEC 7811 specifies requirements for embossed characters on identification cards. The embossed characters are intended for transfer of data either by use of imprinters or by visual or machine reading. It takes into consideration both human and machine aspects and states minimum requirements.

ISO/IEC 7811-3 Identification cards—Recording technique—Part 3: Location of embossed characters on ID-1 cards ISO 7812 & 7814—Location of magnetic stripe material and Surface Profile ISO 7813 Identification cards—Financial transaction cards Specifies that the dimensions of financial transaction cards shall be 0.76+ or −0.08 mm (0.030+ or −0.0003 in.) thick, 85.47 mm (3.375 in.) wide and 54.03 mm (2.127 in.) high.

ISO 7816-1 Identification cards—Integrated circuit(s) cards with contacts—Part 1: Physical characteristics Specifies the physical characteristics of integrating circuit(s) cards with contacts. It applies to identification cards of the ID-1 card type, which may include embossing and/or a magnetic stripe, as specified in American National Standard for Identification ISO/IEC 7816-2 Information technology—Identification cards—Integrated circuit(s) cards with contacts—Part 2: Dimensions and location of contacts. Specifies the dimensions, locations and assignment for each of the contacts on integrated circuit(s) cards of an ID-1 card type. To be used in conjunction with ISO/IEC 7816-1.

ISO/IEC 7816-3 Information technology—Identification Cards—Integrated circuit(s) cards with contacts—Part 3: Electronic signals and transmission protocols Specifies the power and signal structures, and information exchange between an integrated circuit(s) card and an interface device such as a terminal. It also covers signal rates, voltage levels, current values, parity convention, operating procedure, transmission mechanisms and communication with the card.

ISO 14443-1—Identification cards—Proximity (RF) Integrated Circuit Cards evolving standard.—Part 1: Physical characteristics Specifies the physical characteristics of proximity cards (PICC). It applies to identification cards of the card type ID-1 operating in proximity of a coupling device. This standard shall be used in conjunction with later parts of ISO/IEC 14443. To obtain an electronic draft: Global Engineering Documents, Inc, http://www.global.ihs.com.

ISO 14443-2—Identification cards—Proximity Integrated Circuit Cards evolving standard.—Part 2: Radio frequency interface and parameters Describes the electrical characteristics of two types of contactless interface between a proximity card and a proximity coupling device. In addition, includes both power and bi-directional communication. Specifies the characteristics of the fields to be provided for power and bi-directional communication between proximity coupling devices (PCDs) and proximity cards (PICCs). This part of ISO/IEC 14443 shall be used in conjunction with other parts of ISO/IEC 14443. This part of ISO/IEC 14443 does not specify the means of generating coupling fields, nor the means of compliance with electromagnetic radiation and human exposure regulations, which can vary according to country.

ISO 14443-3—Identification cards—Proximity Integrated Circuit Cards evolving standard.—Part 3: Electronic signals and transmission protocols ISO 14443-3—Identification cards—Proximity Integrated Circuit Cards evolving standard.—Part 4: Security features Describes (a) polling for proximity cards (PICCs) entering the field of a proximity coupling device (PCD); (b) the byte format, the frames and timing used during the initial phase of communication between PCDs and PICCs; (c) the initial Request and Answer to Request command content; (d) methods to detect and communicate with one PICC among several PICCs (anticollision); (e) other parameters required to initialize communications between a PICC and PCD; and (f) optional means to ease and speed up the selection of one PICC among several PICCs based on application criteria.

ISO/IEC 10373 Identification cards—Test methods

ISO/IEC 78164 Information technology—Identification cards—Integrated circuit(s) cards with contacts—Part 4: Inter-industry commands for interchange Specifies a half-duplex block transmission protocol featuring the special needs of a contactless environment and defines the activation and deactivation sequence of the protocol. This part of ISO/IEC 14443 is intended to be used in conjunction with other parts of ISO/IEC 14443 and is applicable to proximity cards of Type A and Type B.

ISO/IEC 7816-5 Identification cards—Integrated circuit(s) cards with contacts—Part 5: Numbering system and registration procedure for application identifiers ISO/IEC 7816-6 Identification cards—Integrated circuit(s) cards with contacts—Part 6: Inter-industry data elements ISO 8583:1987 Bank card originated messages—Interchange message specifications—Content for financial transactions ISO 8583:1993 Financial transaction card originated messages—Interchange message specifications ISO/IEC 8825-1 Information technology—ASN.1 encoding rules: Specification of Basic Encoding Rules (BER), Canonical Encoding Rules (CER) and Distinguished Encoding Rules (DER)

ISO/IEC 8859 Information processing—8-bit single-byte coded graphic character sets ISO 9362 Banking—Banking telecommunication messages—Bank identifier codes ISO 9564-1 Banking—PIN management and security—Part 1: Basic principles and requirements for online PIN handling in ATM and POS systems ISO 9564-3 Banking—PIN management and security—Part 3: Requirements for offline PIN handling in ATM and POS systems ISO/IEC 9796-2:2002 Information technology—Security techniques—Digital signature schemes giving message recovery—Part 2: Integer factorization based mechanisms ISO/IEC 9797-1 Information technology—Security techniques—Message Authentication Codes—Part 1: Mechanisms using a block cipher ISO/IEC 10116 Information technology—Security techniques—Modes of peration for an n-bit block cipher ISO/IEC 10118-3 Information technology—Security techniques—Hash-functions—Part 3: Dedicated hash-functions ISO 11568-2:1994 Banking—Key management (retail)—Part 2: Key management techniques for symmetric ciphers ISO 13491-1 Banking—Secure cryptographic devices (retail)—Part 1: Concepts, requirements and evaluation methods ISO 13616 Banking and related financial services—International bank account number (IBAN)

ISO 16609 Banking—Requirements for message authentication using symmetric techniques ISO 639-1 Codes for the representation of names of languages—Part 1: Alpha-2 Code Note: This standard is updated continuously by ISO. Additions/changes to ISO 639-1:1988: Codes for the Representation of Names of Languages are available on: http://lcweb.loc.gov/standards/iso639-2/codechanges.html ISO 3166 Codes for the representation of names of countries and their subdivisions ISO 4217 codes for the representation of currencies and Funds FIPS 180-2 Secure Hash Standard

What is claimed is:

1. A thin, layered structure of laminated configuration comprising:
   a first laminatable layer;
   a display cell coupled to said first layer;
   at least one pre-formed component connection layer coupled to said display cell;
   a buffer layer of formable material disposed over said at least one pre-formed component connection layer, said display cell, and components thereof of varying thicknesses; and
   a second laminatable layer disposed over said buffer layer, said buffer layer configured to compensate for the varying thicknesses to provide a substantially uniform overall thickness to the layered structure.

2. The layered structure of claim 1 further comprising:
   an integrated circuit component coupled to said display cell; and
   at least one display component of said display cell formed by printing a plurality of pixels that are operably electronically connected to the integrated circuit component.

3. The layered structure of claim 2 wherein the plurality of pixels are matingly connected to display-receiving connection points.

4. The layered structure of claim 1 wherein the first laminatable layer is suitable for lamination to an adjacent lower cover surface.

5. The layered structure of claim 1 wherein the second laminatable layer is suitable for lamination to an adjacent upper cover surface.

6. The layered structure of claim 2 further comprising a chip contact plate having electrical traces coupling the integrated circuit component thereto, from a laterally adjacent position.

7. The layered structure of claim 6 wherein the chip contact plate is a contact plate for a smart card and the integrated circuit component is configured to perform smart card functions.

8. The layered structure of claim 1 wherein the component connection layer is pre-formed with apertures to receive components and to assist in compensating for thickness differences among components between the first laminatable layer and the second laminatable layer.

9. The layered structure of claim 1 wherein the component connection layer is pre-formed with apertures to receive components and to assist in compensating for thickness differences among components between the first laminatable layer and the second laminatable layer, and the buffer layer is formable to fill cavities associated with the apertures.

10. The layered structure of claim 1 wherein the component connection layer has electrical traces printed on upper and lower surfaces thereof.

11. A thin, layered core structure for providing in a laminated unit electronic components for information processing, the layered structure comprising:
    a base layer and a top layer of laminatible material;
    at least one pre-formed component connection layer disposed between the base layer and top layer;
    at least one electronic component coupled to said at least one pre-formed component connection layer; and
    a buffer layer configured between the base layer and top layer, the buffer layer being made of a formable material that compensates for thickness differences among said at least one electronic component and components of said at least one pre-formed component connection layer between the base layer and top layer.

12. The layered structure of claim 11 wherein the at least one electronic component is an integrated circuit component.

13. The layered structure of claim 11 wherein the at least one electronic component is a magnetic stripe emulator.

14. The layered structure of claim 11 wherein the at least one electronic component is a biometric sensor.

15. The layered structure of claim 12 further comprising a chip contact plate having electrical traces coupling the integrated circuit component thereto, from a laterally adjacent position.

16. The layered structure of claim 15 wherein the chip contact plate is a contact plate for a smart card and the integrated circuit component is configured to perform smart card functions.

* * * * *